US012685063B2

(12) United States Patent (10) Patent No.: US 12,685,063 B2
Yahagi (45) Date of Patent: Jul. 14, 2026

(54) PRE-WET MODULE

(71) Applicant: EBARA CORPORATION, Tokyo (JP)

(72) Inventor: Mitsutoshi Yahagi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 215 days.

(21) Appl. No.: 18/278,154

(22) PCT Filed: Aug. 8, 2022

(86) PCT No.: PCT/JP2022/030266
§ 371 (c)(1),
(2) Date: Aug. 21, 2023

(87) PCT Pub. No.: WO2024/033966
PCT Pub. Date: Feb. 15, 2024

(65) Prior Publication Data
US 2025/0038014 A1 Jan. 30, 2025

(51) Int. Cl.
*H10P 72/00* (2026.01)
*C25D 7/12* (2006.01)
(Continued)

(52) U.S. Cl.
CPC ...... *H10P 72/0414* (2026.01); *H10P 72/0476* (2026.01); *H10P 72/7618* (2026.01);
(Continued)

(58) Field of Classification Search
CPC ........... H01L 21/67051; H01L 21/6723; H01L 21/68764; H01L 21/288; H01L 21/304;
(Continued)

(56) References Cited

U.S. PATENT DOCUMENTS

2016/0074913 A1* 3/2016 Hanawa ............ H01L 21/67051
134/1
2019/0103294 A1* 4/2019 Masutomi ......... H01L 21/67086
(Continued)

FOREIGN PATENT DOCUMENTS

CN 114551278 A 5/2022
CN 114752976 A * 7/2022 ............. C25D 17/06
(Continued)

OTHER PUBLICATIONS

CN114752976 translation (Year: 2022).*
KR20220002125 translation (Year: 2022).*
KR10112328 (KR20100018724) translation (Year: 2012).*

*Primary Examiner* — Michael E Barr
*Assistant Examiner* — Lauren G Orta
(74) *Attorney, Agent, or Firm* — BakerHostetler

(57) ABSTRACT

To achieve a small-sized pre-wet module that can perform different pre-processes.
A pre-wet module 200 includes a stage 220, a rotation mechanism 224, a cleaning liquid supply member 260, and a deaerated liquid supply member 250. The stage 220 is configured to hold a back surface of a substrate WF with a surface to be processed WF-a facing upward. The rotation mechanism 224 is configured to rotate the stage 220. The cleaning liquid supply member 260 has a nozzle 262 arranged above the stage 220. The cleaning liquid supply member 260 is configured to supply a cleaning liquid in a direction to the stage 220 via the nozzle 262. The deaerated liquid supply member 250 is configured to supply a deaerated liquid to a surface to be processed WF-a of a substrate WF held onto the stage 220. The deaerated liquid supply member 250 is configured to be movable between a supply position and a retracted position. The supply position is located between the nozzle 262 and the surface to be processed WF-a of the substrate WF, and the retracted
(Continued)

200 position is retracted from between the nozzle 262 and the surface to be processed WF-a of the substrate WF.

8 Claims, 21 Drawing Sheets

(51) Int. Cl.
| | |
|---|---|
| *C25D 17/00* | (2006.01) |
| *H10P 14/46* | (2026.01) |
| *H10P 52/00* | (2026.01) |
| *H10P 72/76* | (2026.01) |

(52) U.S. Cl.
CPC ............... *C25D 7/12* (2013.01); *C25D 17/00* (2013.01); *H10P 52/00* (2026.01); *H10P 72/0416* (2026.01); *H10P 72/0448* (2026.01); *H10P 72/0462* (2026.01)

(58) Field of Classification Search
CPC ........... H01L 21/67057; H01L 21/6715; H01L 21/6719; H01L 21/67751; H01L 21/67086; H01L 21/67253; H01L 21/67757; C25D 7/12; C25D 17/00; B08B 3/048; B08B 3/10
See application file for complete search history.

(56) References Cited

U.S. PATENT DOCUMENTS

| | | | | |
|---|---|---|---|---|
| 2022/0203415 A1* | 6/2022 | Kwak | ............... | H01L 21/67748 |
| 2022/0379352 A1 | 12/2022 | Seki et al. | | |

FOREIGN PATENT DOCUMENTS

| | | | | | |
|---|---|---|---|---|---|
| JP | 2011-211095 | A | 10/2011 | | |
| JP | 2013-249495 | A | 12/2013 | | |
| JP | 2017-188665 | A | 10/2017 | | |
| JP | 6990346 | B1 | 1/2022 | | |
| JP | 7008863 | B1 | 1/2022 | | |
| JP | 2022-063026 | A | 4/2022 | | |
| KR | 101102328 | B1 * | 1/2012 | ............. | C25D 17/04 |
| KR | 20220002125 | A * | 1/2022 | ....... | H01L 21/67253 |
| WO | WO 2022/254486 | A1 | 12/2022 | | |

\* cited by examiner

PRE-WET MODULE

CROSS-REFERENCE TO RELATED APPLICATIONS

This application is a U.S. national phase application of International Patent Application No. PCT/JP2022/030266 filed Aug. 8, 2022, which is incorporated by reference in its entirety for any and all purposes.

TECHNICAL FIELD

This application relates to a pre-wet module.

BACKGROUND ART

A plating apparatus for performing a plating process on a substrate (such as a semiconductor wafer) includes pre-wet modules for performing various pre-processes, such as a deaeration process, on substrates and plating modules for performing a plating process on the substrates on which the pre-processes have been performed.

For example, PTL 1 discloses a pre-wet module including a substrate holder that can simultaneously hold a first substrate and a second substrate. The pre-wet module is configured to concurrently perform different pre-processes on a plurality of substrates in an efficient manner, for example, dipping a first substrate in a deaeration tank to perform a deaeration process on the first substrate while supplying a cleaning liquid to a second substrate to perform a cleaning process on the second substrate.

CITATION LIST

Patent Literature

PTL 1: Japanese Patent No. 7008863

SUMMARY OF INVENTION

Technical Problem

However, in the prior art, downsizing the structure of a pre-wet module is not considered.

That is, in the prior art, a substrate holder is arranged between a deaeration tank in which a deaerated liquid is accumulated and a nozzle that supplies a cleaning liquid from above the deaeration tank and pre-processes are performed while the substrate holder is inverted upside down and moved in the vertical direction. Since this configuration requires a wide space for inverting the substrate holder upside down and moving it up and down, the size of the pre-wet module, especially the size in the height direction increases.

Therefore, this application has one object to achieve a small-sized pre-wet module that can perform different pre-processes.

Solution to Problem

According to one embodiment, a pre-wet module is disclosed. The pre-wet module includes a stage, a rotation mechanism, a cleaning liquid supply member, and a deaerated liquid supply member. The stage is configured to hold a back surface of a substrate with a surface to be processed facing upward. The rotation mechanism is configured to rotate the stage. The cleaning liquid supply member has a nozzle arranged above the stage. The cleaning liquid supply member is configured to supply a cleaning liquid in a direction to the stage via the nozzle. The deaerated liquid supply member is configured to supply a deaerated liquid to a surface to be processed of a substrate held onto the stage. The deaerated liquid supply member is configured to be movable between a supply position and a retracted position. The supply position is located between the nozzle and the surface to be processed of the substrate, and the retracted position is retracted from between the nozzle and the surface to be processed of the substrate.

DESCRIPTION OF EMBODIMENTS

Figure 1:
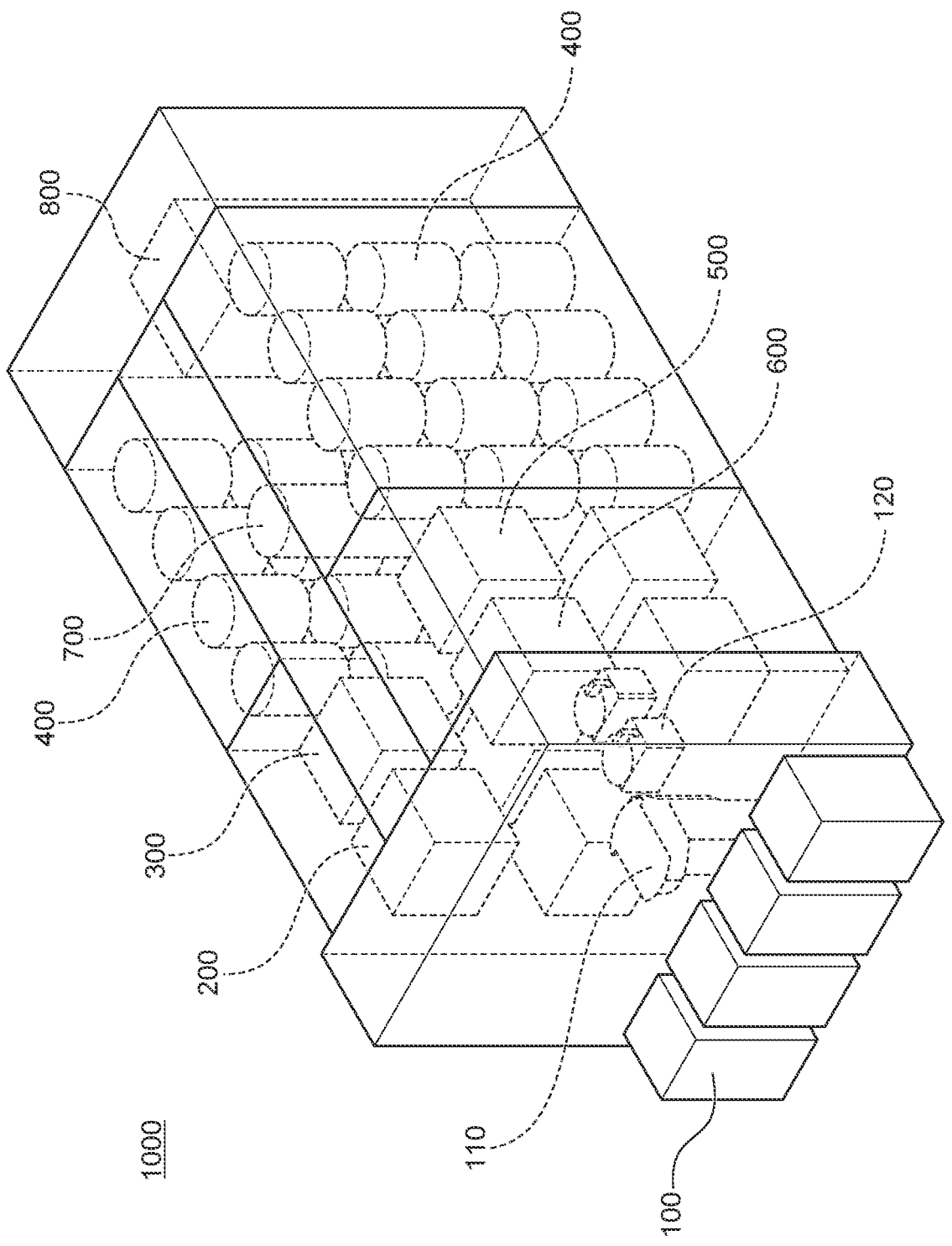
FIG. 1 is a perspective view illustrating the overall configuration of a plating apparatus of an embodiment.

The following describes embodiments of the present invention with reference to the drawings. In the drawings that will be described below, components that are identical or correspond to one another will be denoted by the same reference numerals, and overlapped descriptions will be omitted.

<Overall Configuration of Plating Apparatus>

Figure 2:
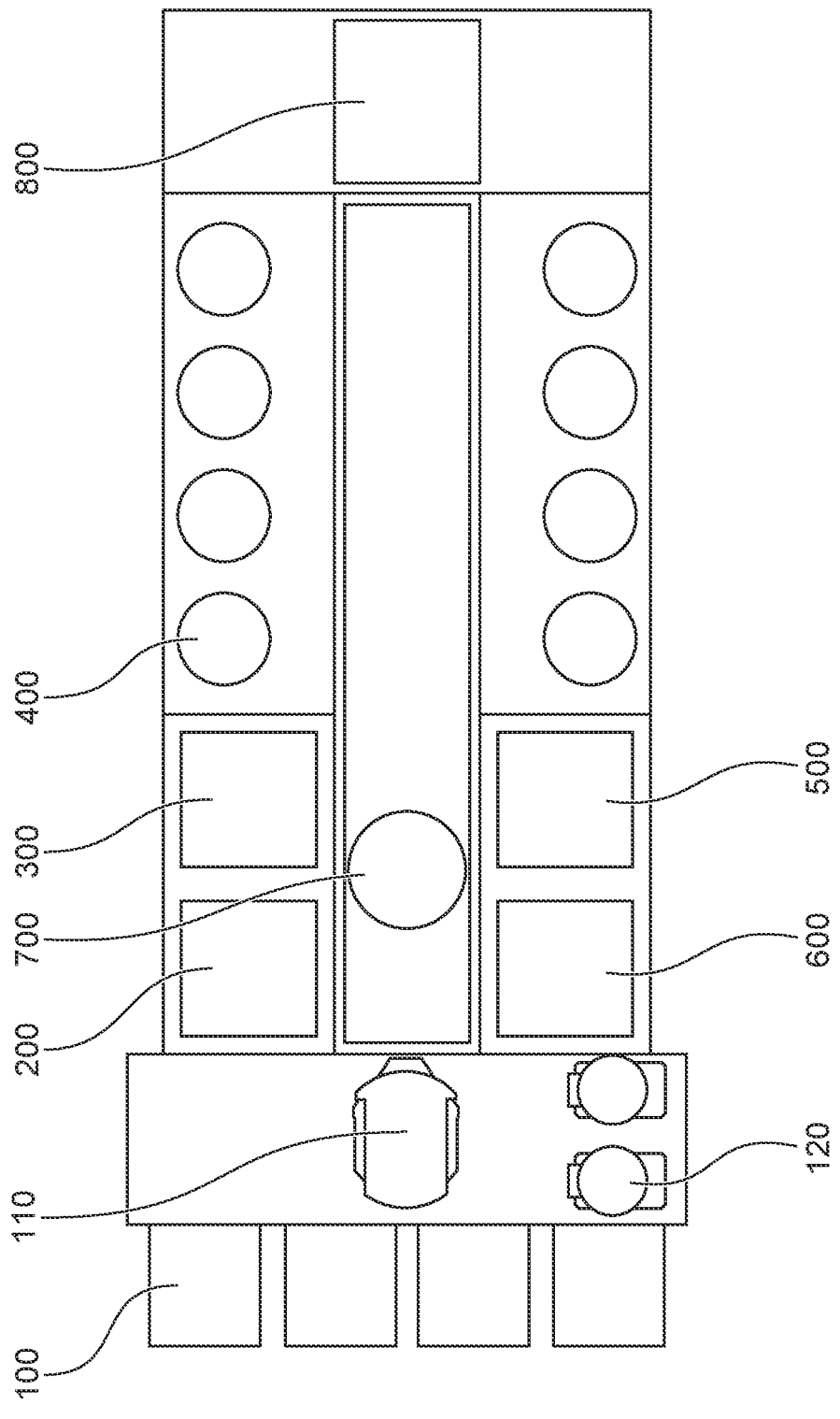
FIG. 2 is a plan view illustrating the overall configuration of the plating apparatus of this embodiment.

FIG. 1 is a perspective view illustrating the overall configuration of the plating apparatus of this embodiment. FIG. 2 is a plan view illustrating the overall configuration of the plating apparatus of this embodiment. As illustrated in FIGS. 1 and 2, a plating apparatus 1000 includes load ports 100, a transfer robot 110, aligners 120, pre-wet modules 200, pre-soak modules 300, plating modules 400, cleaning modules 500, spin rinse dryers 600, a transfer device 700, and a control module 800.

The load port 100 is a module for loading a substrate housed in a cassette, such as a FOUP, (not illustrated) to the plating apparatus 1000 and unloading the substrate from the plating apparatus 1000 to the cassette. While the four load ports 100 are arranged in the horizontal direction in this embodiment, the number of load ports 100 and arrangement of the load ports 100 are arbitrary. The transfer robot 110 is a robot for transferring the substrate that is configured to grip or release the substrate between the load port 100, the aligner 120, the pre-wet module 200, and the spin rinse dryers 600. The transfer robot 110 and the transfer device 700 can perform delivery and receipt of the substrate via a temporary placement table (not illustrated) to grip or release the substrate between the transfer robot 110 and the transfer device 700.

The aligner 120 is a module for adjusting a position of an orientation flat, a notch, and the like of the substrate in a predetermined direction. While the two aligners 120 are disposed to be arranged in the horizontal direction in this embodiment, the number of aligners 120 and arrangement of the aligners 120 are arbitrary. The pre-wet module 200 wets a surface to be plated of the substrate before a plating process with a process liquid, such as pure water or deaerated water, to replace air inside a pattern formed on the surface of the substrate with the process liquid. The pre-wet module 200 is configured to perform a pre-wet process to facilitate supplying the plating solution to the inside of the pattern by replacing the process liquid inside the pattern with a plating solution during plating. While the two pre-wet modules 200 are disposed to be arranged in the vertical direction in this embodiment, the number of pre-wet modules 200 and arrangement of the pre-wet modules 200 are arbitrary.

For example, the pre-soak module 300 is configured to remove an oxidized film having a large electrical resistance present on, a surface of a seed layer formed on the surface to be plated of the substrate before the plating process by etching with a process liquid, such as sulfuric acid and hydrochloric acid, and perform a pre-soak process that cleans or activates a surface of a plating base layer. While the two pre-soak modules 300 are disposed to be arranged in the vertical direction in this embodiment, the number of pre-soak modules 300 and arrangement of the pre-soak modules 300 are arbitrary. The plating module 400 performs the plating process on the substrate. There are two sets of the 12 plating modules 400 arranged by three in the vertical direction and by four in the horizontal direction, and the total 24 plating modules 400 are disposed in this embodiment, but the number of plating modules 400 and arrangement of the plating modules 400 are arbitrary.

The cleaning module 500 is configured to perform a cleaning process on the substrate to remove the plating solution or the like left on the substrate after the plating process. While the two cleaning modules 500 are disposed to be arranged in the vertical direction in this embodiment, the number of cleaning modules 500 and arrangement of the cleaning modules 500 are arbitrary. The spin rinse dryer 600 is a module for rotating the substrate after the cleaning process at high speed and drying the substrate. While the two spin rinse dryers are disposed to be arranged in the vertical direction in this embodiment, the number of spin rinse dryers and arrangement of the spin rinse dryers are arbitrary. The transfer device 700 is a device for transferring the substrate between the plurality of modules inside the plating apparatus 1000. The control module 800 is configured to control the plurality of modules in the plating apparatus 1000 and can be configured of, for example, a general computer including input/output interfaces with an operator or a dedicated computer.

An example of a sequence of the plating processes by the plating apparatus 1000 will be described. First, the substrate housed in the cassette is loaded on the load port 100. Subsequently, the transfer robot 110 grips the substrate from the cassette at the load port 100 and transfers the substrate to the aligners 120. The aligner 120 adjusts the position of the orientation flat, the notch, or the like of the substrate in the predetermined direction. The transfer robot 110 grips or releases the substrate whose direction is adjusted with the aligners 120 to the pre-wet module 200.

The pre-wet module 200 performs the pre-wet process on the substrate. The transfer device 700 transfers the substrate on which the pre-wet process has been performed to the pre-soak module 300. The pre-soak module 300 performs the pre-soak process on the substrate. The transfer device 700 transfers the substrate on which the pre-soak process has been performed to the plating module 400. The plating module 400 performs the plating process on the substrate.

The transfer device 700 transfers the substrate on which the plating process has been performed to the cleaning module 500. The cleaning module 500 performs the cleaning process on the substrate. The transfer device 700 transfers the substrate on which the cleaning process has been performed to the spin rinse dryer 600. The spin rinse dryer 600 performs the drying process on the substrate. The transfer robot 110 receives the substrate from the spin rinse dryer 600 and transfers the substrate, on which the drying process is performed, to the cassette at the load port 100. Finally, the cassette housing the substrate is unloaded from the load port 100.

<Configuration of Pre-Wet Module>

Next, the configuration of the pre-wet module 200 will be described. Since the two pre-wet modules 200 in this embodiment have an identical configuration, only one pre-wet module 200 will be described.

Figure 3:
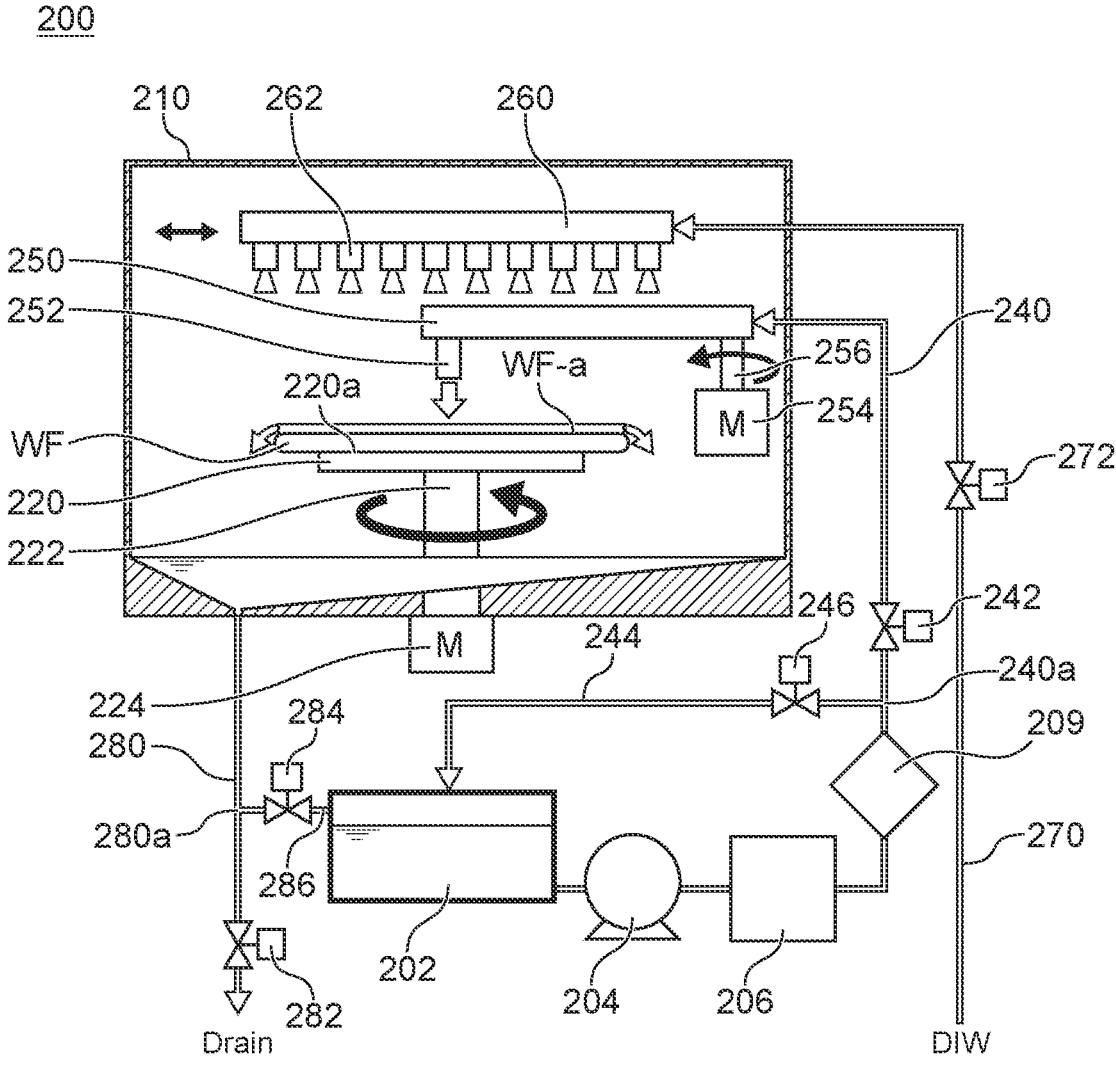
FIG. 3 is a vertical cross-sectional view schematically illustrating the configuration of a pre-wet module of one embodiment.

FIG. 3 is a vertical cross-sectional view schematically illustrating the configuration of a pre-wet module of one embodiment. As illustrated in FIG. 3, the pre-wet module 200 includes a circular-plate shaped stage 220 configured to hold a substrate WF. The stage 220 has a substrate holding surface 220a for holding the back surface of a surface to be processed WF-a of the substrate WF and is configured to hold the substrate WF with the surface to be processed WF-a facing upward. The stage 220 is connected to a vacuum source (not illustrated) and configured to hold the substrate WF by vacuum suctioning the back surface of the substrate WF. A shaft 222 extending in the vertical direction is attached to the center of the lower surface of the stage 220. The pre-wet module 200 includes a rotation mechanism 224 configured to rotate the stage 220 around the axis of the shaft 222. The rotation mechanism 224 can be achieved by a known mechanism, such as a motor. The rotation mechanism 224 is configured to rotate the stage 220 when a cleaning process and a deaeration process are being performed.

The pre-wet module 200 includes a cleaning liquid supply member 260 that supplies a cleaning liquid for cleaning the surface to be processed WF-a of the substrate WF. The cleaning liquid supply member 260 has nozzles 262 arranged above the stage 220 so as to be opposed to the surface to be processed WF-a of the substrate WF. A pipe 270 for supplying the cleaning liquid is connected to the nozzles 262. The pipe 270 includes a supply valve 272 for opening and closing the pipe 270. When the supply valve 272 is opened, the cleaning liquid is supplied from a reservoir tank (not illustrated) to the nozzles 262. The cleaning liquid supply member 260 is configured to supply the cleaning liquid in the direction of the stage 220 via the nozzles 262. This allows cleaning the surface to be processed WF-a of the substrate WF held onto the stage 220. The cleaning liquid supply member 260 may be configured to swing in the horizontal direction (direction along the surface to be processed WF-a of the substrate WF) by a drive mechanism (not illustrated).

The pre-wet module 200 includes a deaerated liquid supply member 250 for supplying a deaerated liquid to the surface to be processed WF-a of the substrate WF. The deaerated liquid supply member 250 has a nozzle 252 for discharging the deaerated liquid. The deaerated liquid supply member 250 is configured to be movable by a rotation mechanism 254, such as a motor. Specifically, the deaerated liquid supply member 250 is configured to be movable between a supply position and a retracted position by turning around a shaft 256 that supports the deaerated liquid supply member 250. The supply position is located between the nozzles 262 and the surface to be processed WF-a of the substrate WF. The retracted position is retracted from between the nozzles 262 and the surface to be processed WF-a of the substrate WF.

FIG. 3 illustrates a state where the deaerated liquid supply member 250 is located at the supply position, and FIG. 4A described below illustrates a state where the deaerated liquid supply member 250 is located at the retracted position. In the state where the deaerated liquid supply member 250 is located at the supply position, the nozzle 252 is arranged at a position corresponding to the center of the surface to be processed WF-a of the substrate WF. When the deaerated liquid is supplied from the nozzle 252 while the substrate WF is rotated by the rotation mechanism 224, the deaerated liquid supplied to the center of the surface to be processed WF-a spreads over the whole surface to be processed WF-a by centrifugal force, therefore allowing the deaeration process to be performed on the whole surface to be processed WF-a.

The pre-wet module 200 includes a circulation tank 202 configured to accumulate the deaerated liquid and a supply pipe 240 that connects the circulation tank 202 to the deaerated liquid supply member 250. The pre-wet module 200 also includes a pump 204, a deaeration unit 206, and a filter 209. The pump 204 is for supplying the deaerated liquid accumulated in the circulation tank 202 via the supply pipe 240 to the deaerated liquid supply member 250. The deaeration unit 206 is for removing dissolved oxygen contained in the deaerated liquid discharged from the pump 204. The filter 209 is for removing dirt and the like contained in the deaerated liquid discharged from the deaeration unit 206. The pre-wet module 200 includes a first circulation pipe 244, a supply valve 242, and a first circulation valve 246. The first circulation pipe 244 is branched from the downstream side of the pump 204 of the supply pipe 240 (specifically, the downstream side of the filter 209) and connected to the circulation tank 202. The supply valve 242 is configured to open and close the downstream side with respect to a branched position 240a of the supply pipe 240 to the first circulation pipe 244. The first circulation valve 246 is configured to open and close the first circulation pipe 244.

The pre-wet module 200 can supply the deaerated liquid to the deaerated liquid supply member 250 by driving the pump 204, opening the supply valve 242, and closing the first circulation valve 246. On the other hand, the pre-wet module 200 can remove the dissolved oxygen contained in the deaerated liquid while circulating the deaerated liquid via the first circulation pipe 244 by driving the pump 204, closing the supply valve 242, and opening the first circulation valve 246.

The pre-wet module 200 includes a liquid discharge pipe 280 and a second circulation pipe 286. The liquid discharge pipe 280 is connected to the bottom portion of a pre-wet chamber 210 that houses the stage 220, the cleaning liquid supply member 260, and the deaerated liquid supply member 250. The second circulation pipe 286 is branched from the liquid discharge pipe 280 and connected to the circulation tank 202. The pre-wet module 200 also includes a liquid discharge valve 282 and a second circulation valve 284. The liquid discharge valve 282 is configured to open and close the downstream side with respect to a branched position 280a of the liquid discharge pipe 280 to the second circulation pipe 286. The second circulation valve 284 is configured to open and close the second circulation pipe 286.

The pre-wet module 200 opens the liquid discharge valve 282 and closes the second circulation valve 284 when the cleaning process is being performed on the substrate WF. This causes the cleaning liquid used for the cleaning process to be discharged to the outside of the pre-wet chamber 210 via the liquid discharge pipe 280. On the other hand, the pre-wet module 200 closes the liquid discharge valve 282 and opens the second circulation valve 284 when the deaeration process is being performed on the substrate WF. This causes the deaerated liquid used for the deaeration process to be returned to the circulation tank 202 via the second circulation valve 284.

Next, operations of the pre-wet module 200 will be described. FIG. 4A to FIG. 4C are drawings for schematically describing operations of the pre-wet module illustrated in FIG. 3.

Figure 4A:
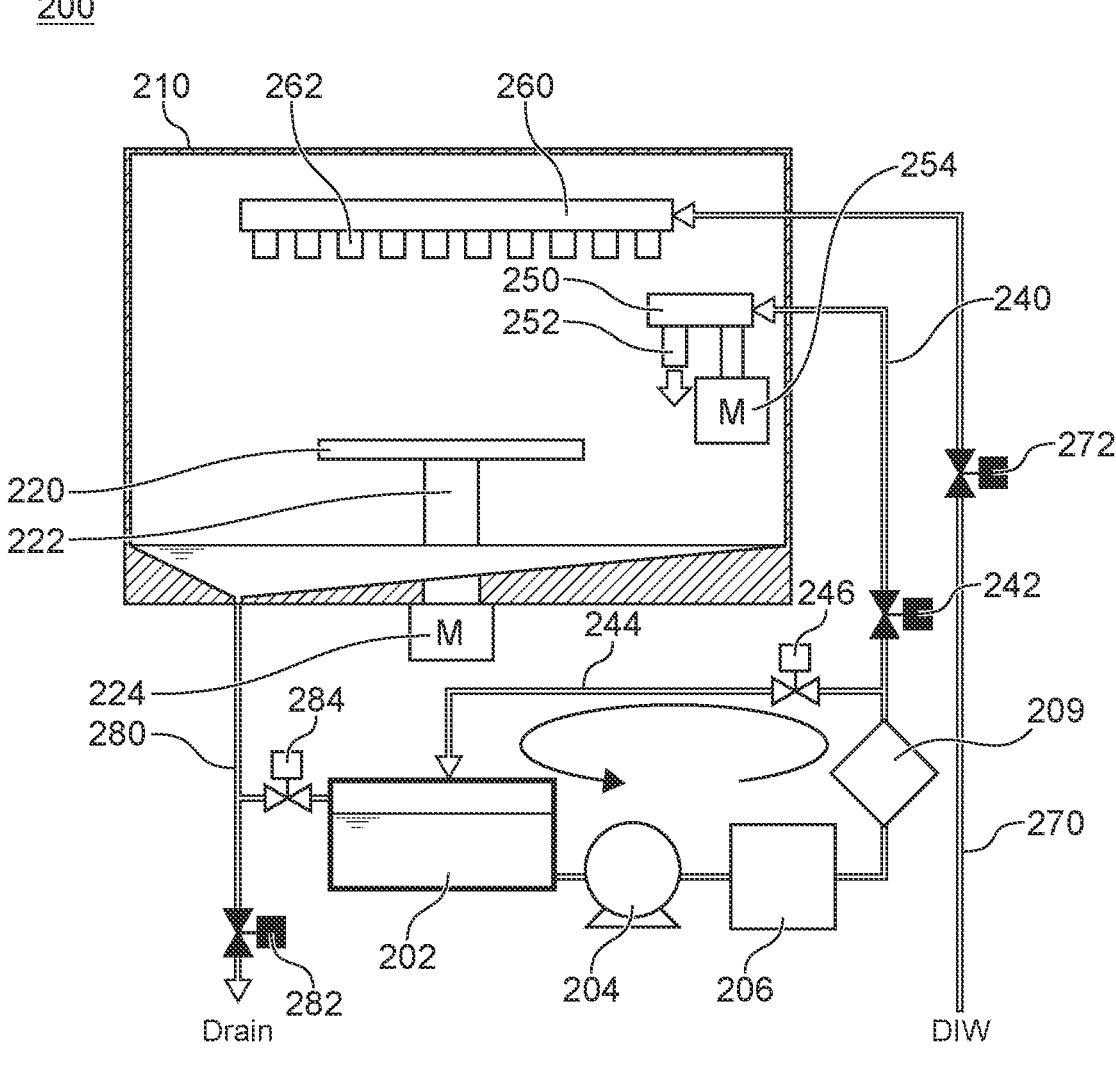
FIG. 4A is a drawing for schematically describing an operation of the pre-wet module illustrated in FIG. 3.
Figure 4B:
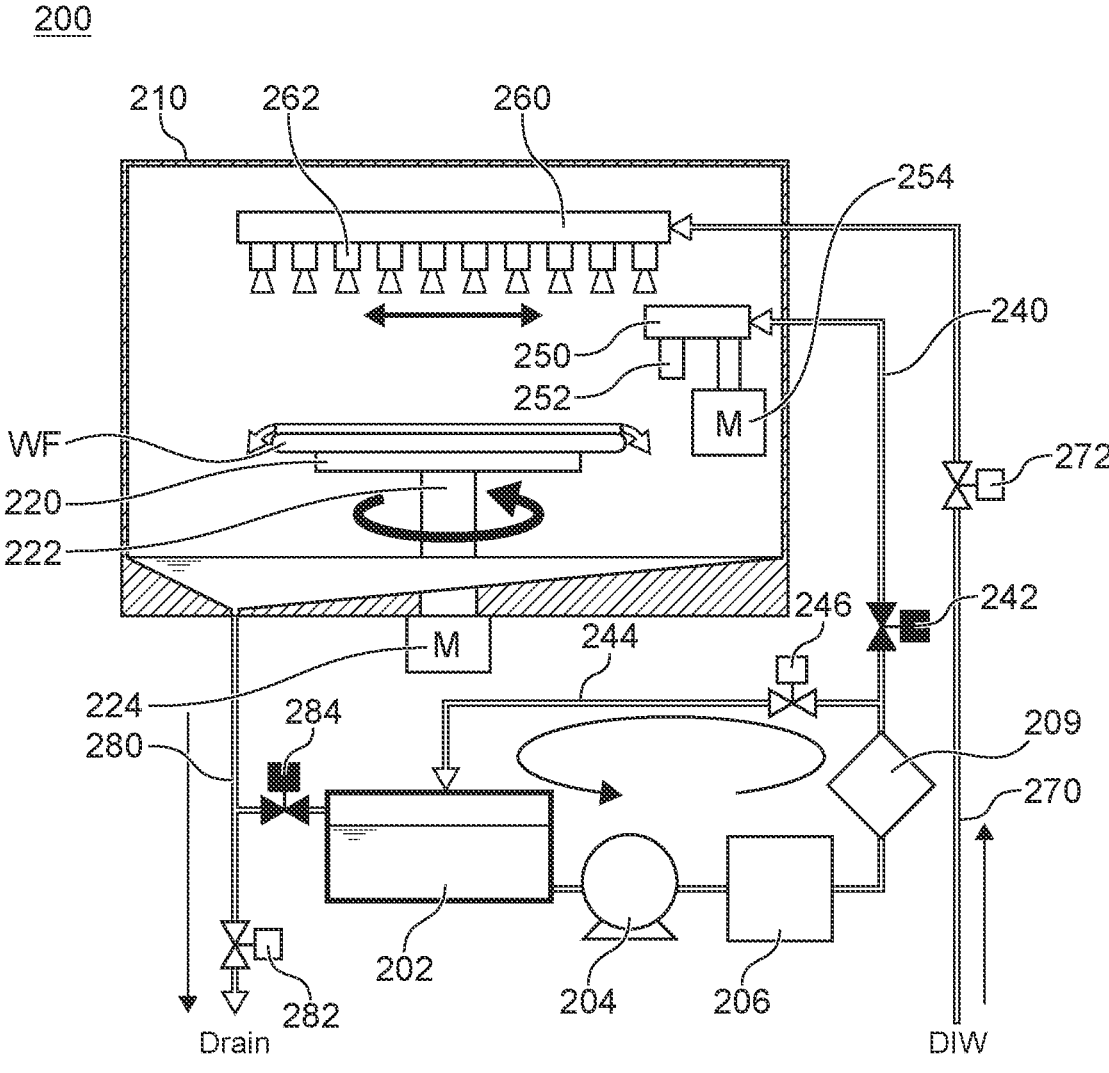
FIG. 4B is a drawing for schematically describing an operation of the pre-wet module illustrated in FIG. 3.
Figure 4C:
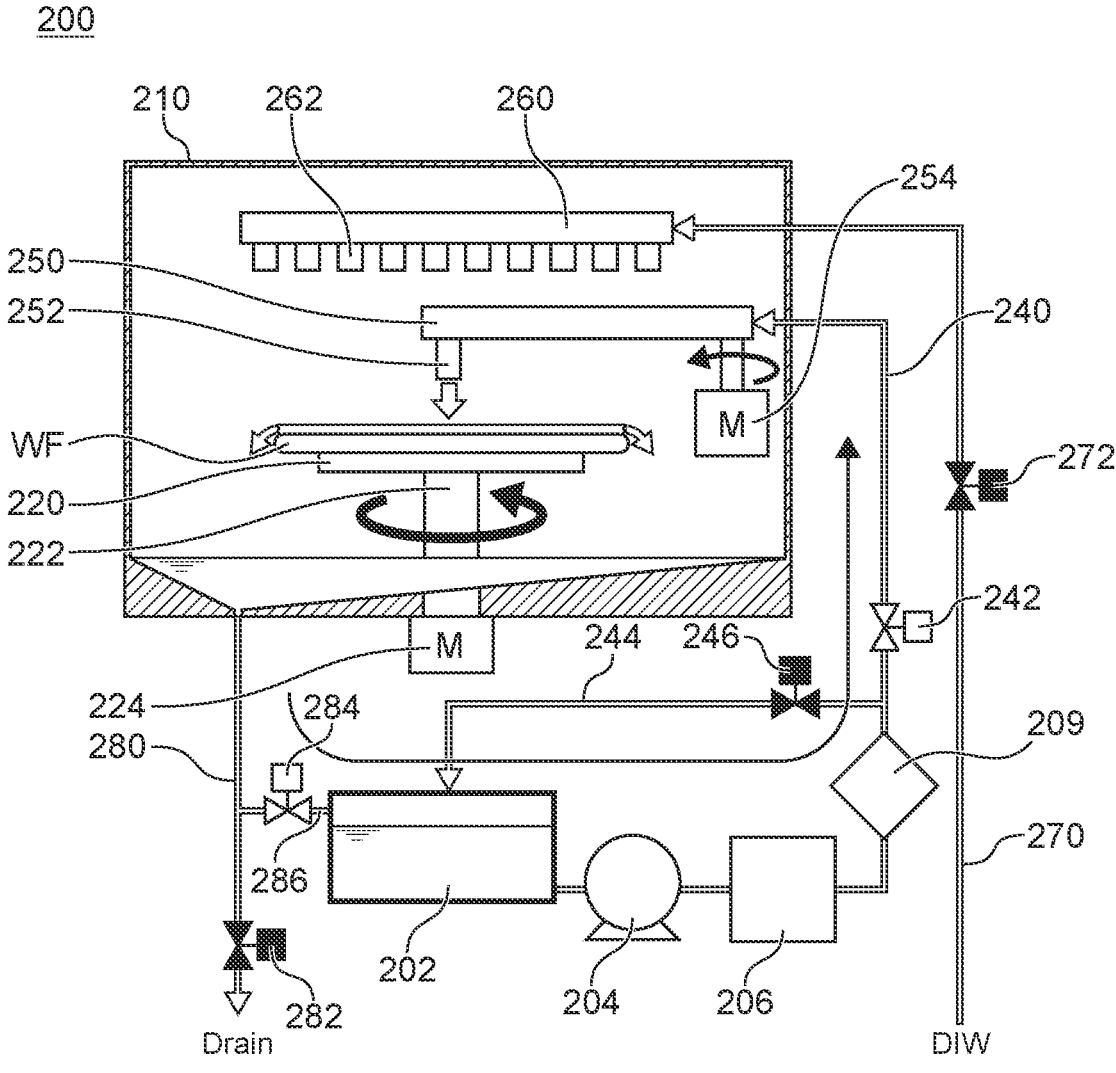
FIG. 4C is a drawing for schematically describing an operation of the pre-wet module illustrated in FIG. 3.

FIG. 4A illustrates an idling state of the pre-wet module 200. As illustrated in FIG. 4A, in the idling state, the pre-wet module 200 turns the deaerated liquid supply member 250 by the rotation mechanism 254 to arrange the deaerated liquid supply member 250 at the retracted position. The pre-wet module 200 closes the supply valve 272. The pre-wet module 200 also drives the pump 204, closes the supply valve 242, and opens the first circulation valve 246. Further, the pre-wet module 200 closes the liquid discharge valve 282 and opens the second circulation valve 284. This results in the pre-wet module 200 removing the dissolved oxygen contained in the deaerated liquid while circulating the deaerated liquid via the first circulation pipe 244.

FIG. 4B illustrates a state where the cleaning process is being performed on the substrate WF after the idling state. As illustrated in FIG. 4B, during the cleaning process, the pre-wet module 200 rotates the stage 220 that holds the substrate WF. The pre-wet module 200 also opens the supply valve 272. Further, the pre-wet module 200 opens the liquid discharge valve 282 and closes the second circulation valve 284. This causes the cleaning liquid to be supplied to the surface to be processed WF-a of the substrate WF from the nozzles 262 of the cleaning liquid supply member 260. The cleaning liquid supplied to the surface to be processed WF-a spreads along the surface to be processed WF-a by centrifugal force in association with the rotation of the substrate WF to clean the surface to be processed WF-a. The cleaning liquid falls from the end portion of the substrate WF, is led to the liquid discharge pipe 280 by an inclination of the bottom surface of the pre-wet chamber 210, and is discharged to the outside of the pre-wet chamber 210.

FIG. 4C illustrates a state where the deaeration process is being performed on the substrate WF after the cleaning process. As illustrated in FIG. 4C, during the deaeration process, the pre-wet module 200 turns the deaerated liquid supply member 250 to arrange the deaerated liquid supply member 250 at the supply position. The pre-wet module 200 closes the supply valve 272. The pre-wet module 200 also opens the supply valve 242 and closes the first circulation valve 246. Further, the pre-wet module 200 closes the liquid discharge valve 282 and opens the second circulation valve 284. This causes the deaerated liquid to be supplied to the center of the surface to be processed WF-a of the substrate WF from the nozzle 252 of the deaerated liquid supply member 250. The deaerated liquid supplied to the center of the surface to be processed WF-a spreads to the end portion of the substrate WF by centrifugal force in association with the rotation of the substrate WF to deaerate the surface to be processed WF-a. The deaerated liquid falls from the end portion of the substrate WF, is led to the liquid discharge pipe 280 by the inclination of the bottom surface of the pre-wet chamber 210, and is returned to the circulation tank 202 via the second circulation pipe 286.

With this embodiment, since the deaeration process is performed on the substrate WF with the surface to be processed WF-a facing upward, gas bubbles accumulating on the surface to be processed WF-a can be suppressed compared with a method in which a substrate with its surface to be processed facing downward is dipped in a deaerated liquid. Additionally, with this embodiment, since the cleaning liquid is supplied to the surface to be processed WF-a via the nozzles 262, the amount of cleaning liquid used is reduced, allowing easy execution of a liquid discharge process compared with the method in which a substrate is dipped. Furthermore, with this embodiment, since the cleaning process and the deaeration process can be performed on the substrate WF held onto the stage 220, it is not necessary to invert upside down a mechanism that holds a substrate and move it up and down, as done in the prior art. Accordingly, since a space for inverting upside down the mechanism that holds a substrate and moving it up and down is not necessary, the size of the pre-wet module 200, especially the size in the height direction can be decreased. As a result, with this embodiment, the small-sized pre-wet module 200 that can perform different pre-processes (cleaning process and deaeration process) can be achieved. In this embodiment, an example in which the plating apparatus 1000 includes two pre-wet modules 200 arranged vertically is described. However, since the pre-wet module 200 can be downsized, for example, three pre-wet modules 200 can be arranged vertically.

Figure 5:
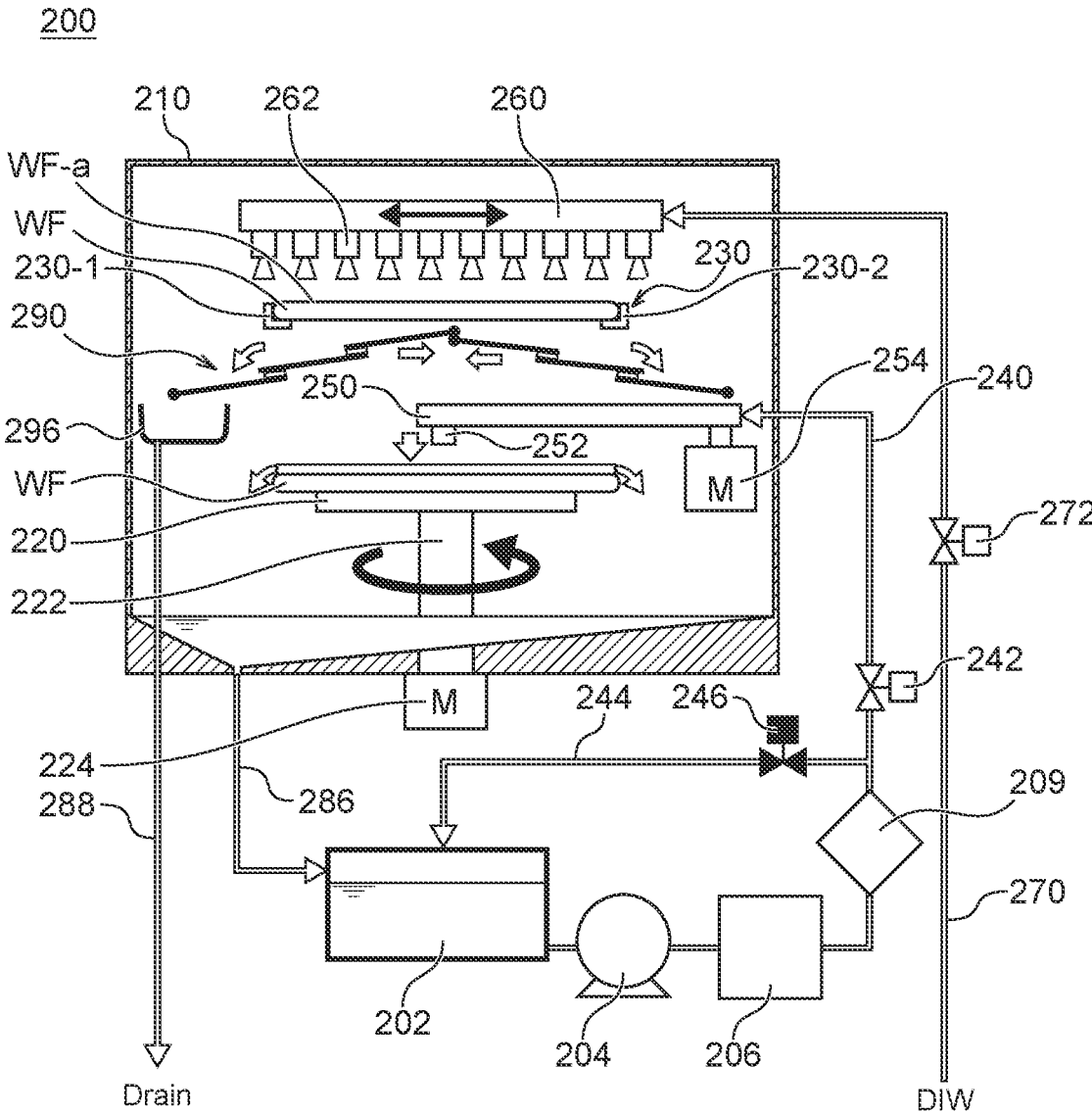
FIG. 5 is a vertical cross-sectional view schematically illustrating the configuration of a pre-wet module of one embodiment.

Next, other embodiments of the pre-wet module 200 will be described. FIG. 5 is a vertical cross-sectional view schematically illustrating the configuration of a pre-wet module of one embodiment. For the configuration similar to that of the pre-wet module described using FIG. 3, descriptions will be omitted.

As illustrated in FIG. 5, the pre-wet module 200 includes a substrate station 230 for holding the substrate WF and performing delivery and receipt of the substrate WF. The substrate station 230 is configured to hold the substrate WF with the surface to be processed WF-a facing upward at a cleaning position between the deaerated liquid supply member 250 arranged at the supply position and the nozzles 262 and move up and down in order to grip or release a substrate from or to the stage 220. Specifically, the substrate station 230 includes a first arm member 230-1 and a second arm member 230-2 for holding the back surface of a surface to be processed of a substrate. The first arm member 230-1 and the second arm member 230-2 are disposed at a distance to be arranged in the horizontal direction. The first arm member 230-1 and the second arm member 230-2 are movable in a direction in which they approach one another and in a direction in which they separate from one another. The first arm member 230-1 and the second arm member 230-2 are configured to hold a substrate when they are located at a substrate holding position in which they approach one another. The first arm member 230-1 and the second arm member 230-2 are configured to move up and down when the delivery and receipt of a substrate to and from the stage 220 are performed.

The pre-wet module 200 includes a shutter member 290 configured to block and open a path for the substrate station 230 to move up and down. The shutter member 290 is configured to block the path for the substrate station 230 to move up and down, that is, between the substrate station 230 and the stage 220, as illustrated in FIG. 5, when the cleaning liquid is supplied from the nozzles 262 to the substrate WF held onto the substrate station 230 arranged at the cleaning position. On the other hand, the shutter member 290 is configured to open the path for the substrate station 230 to move up and down when the delivery and receipt of a substrate is performed between the substrate station 230 and the stage 220, for example, as illustrated in FIG. 9B described below.

In this embodiment, the rotation mechanism 224 is configured to rotate the stage 220 when the deaeration process is being performed. Further, in this embodiment, the liquid discharge pipe 280 is not disposed, and instead, the second circulation pipe 286 directly connects the bottom portion of the pre-wet chamber 210 to the circulation tank 202. In the second circulation pipe 286, a valve is not disposed. This causes the deaerated liquid used for the deaeration process to be directly circulated to the circulation tank 202. The pre-wet module 200 also includes a drain pan 296 configured to receive the cleaning liquid supplied from the nozzles 262 to clean the substrate WF and then dropped from the shutter member 290. The pre-wet module 200 also includes a drain pipe 288 for discharging the cleaning liquid received by the drain pan 296 to the outside of the pre-wet chamber 210. The drain pipe 288 is configured to discharge the cleaning liquid independently from the second circulation pipe 286. This can suppress the cleaning liquid being mixed into the circulation tank 202.

Figure 6A:
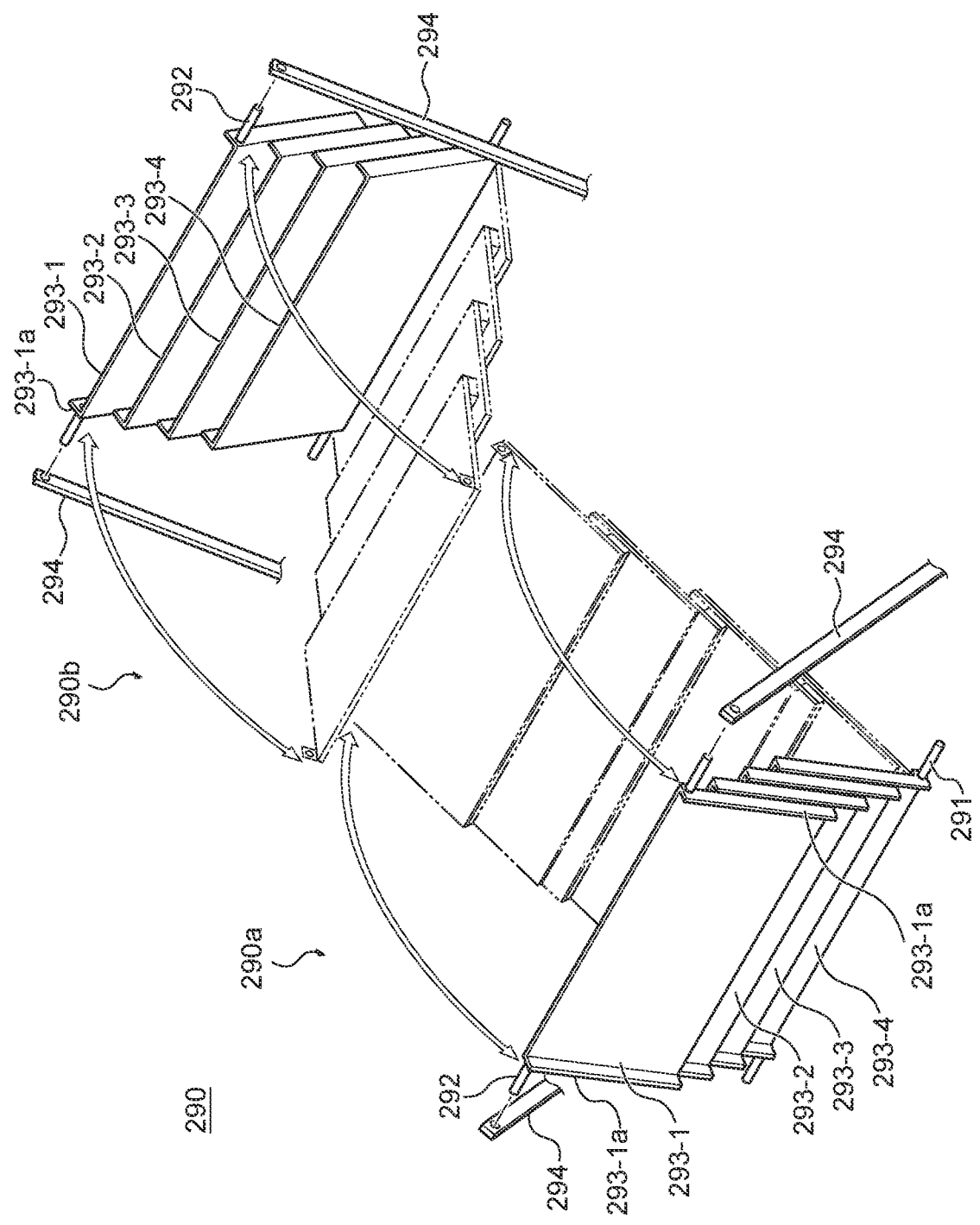
FIG. 6A is a drawing schematically illustrating one exemplary configuration of a shutter member.
Figure 6B:
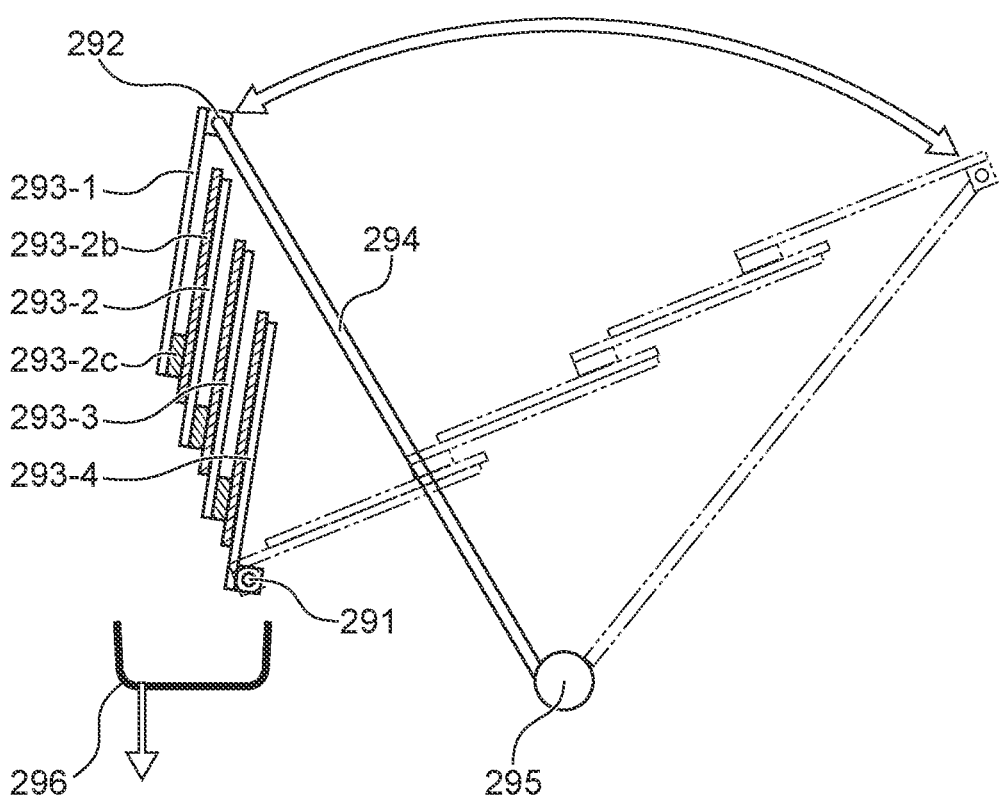
FIG. 6B is a drawing schematically illustrating the one exemplary configuration of the shutter member.

Next, details of the shutter member 290 will be described. FIGS. 6A and 6B are drawings schematically illustrating one exemplary configuration of a shutter member. As illustrated in FIG. 6A, the shutter member 290 has a first shutter member 290a and a second shutter member 290b arranged symmetrically. The shutter member 290 is configured to open and block the path for the substrate station 230 to move up and down by opening and closing the first shutter member 290a and the second shutter member 290b. Since the first shutter member 290a and the second shutter member 290b have a similar configuration, only the first shutter member 290a will be described.

As illustrated in FIGS. 6A and 6B, the first shutter member 290a has a plurality of (four in this embodiment) rectangular plates 293-1 to 293-4. Rails and sliders are disposed between the plates 293-1 to 293-4. The plates 293-1 to 293-4 are coupled so as to slidably move mutually via the rails and the sliders. Specifically, a rail 293-2b extending in an open/close direction of the first shutter member 290a and a slider 293-2c movable along the rail 293-2b are disposed on the upper surface of the plate 293-2. The plate 293-1 is coupled to the plate 293-2 via the slider 293-2c. This allows the plate 293-1 to be coupled slidably movably to the plate 293-2. Similarly, the plate 293-2 is coupled slidably movably to the plate 293-3, and the plate 293-3 is coupled slidably movably to the plate 293-4. The drain pan 296 is arranged below the lower end portion of the plate 293-4.

The plate 293-1 has banks 293-1a formed at both end portions in a direction perpendicular to the open/close direction of the first shutter member 290a. The formation of the banks 293-1a avoids the cleaning liquid dropped on the upper surface of the plate 293-1 flowing down in the direction perpendicular to the open/close direction of the first shutter member 290a. In this respect, the same applies to the plates 293-2 to 293-4. In addition, the upper surfaces of the plates 293-1 to 293-4 form inclined surfaces declining toward the drain pan 296 when the first shutter member 290a is closed. This causes the cleaning liquid dropped on the upper surfaces of the plates 293-1 to 293-4 to flow into the drain pan 296.

The lower end portion of the plate 293-4 is connected to a fixed shaft 291 extending in the horizontal direction perpendicular to the open/close direction of the first shutter member 290a. The plate 293-4 is rotatable around the fixed shaft 291. On the other hand, the upper end portion of the plate 293-1 is connected to a movable shaft 292 extending in the horizontal direction perpendicular to the open/close direction of the first shutter member 290a. The movable shaft 292 has both end portions connected to respective support pillars 294. The support pillars 294 are connected to respective rotation mechanisms 295 and rotatable centering around the rotation mechanisms 295. The rotation mechanism 295 is an exemplary drive mechanism configured to block the path for the substrate station 230 to move up and down by slidably moving the plates 293-1 to 293-4 so as to outspread them and open the path for the substrate station 230 to move up and down by slidably moving the plates 293-1 to 293-4 so as to fold them. The rotation mechanism 295 can be achieved by a known mechanism, such as a rotary cylinder.

By rotating the support pillars 294 clockwise in the viewpoint of FIG. 6B, the first shutter member 290a can be put in a blocking state (a state where the path for the substrate station 230 to move up and down is blocked). Conversely, by rotating the support pillars 294 counterclockwise in the viewpoint of FIG. 6B, the plates 293-1 to 293-4 are folded, allowing the first shutter member 290a to be put in an opening state (a state where the path for the substrate station 230 to move up and down is opened). While the first shutter member 290a and the second shutter member 290b have symmetrical and similar configurations, they are arranged such that both the upper end portions of the plates 293-1 are overlapped one another in the vertical direction in the blocking state as illustrated in FIG. 6A. This can suppress the cleaning liquid dropped on the shutter member 290 falling from between the first shutter member 290a and the second shutter member 290b.

The shutter member 290 has a function to suppress the cleaning liquid being mixed into the deaerated liquid. That is, putting the first shutter member 290a and the second shutter member 290b in the blocking state can suppress the cleaning liquid used for cleaning the substrate WF held onto the substrate station 230 dropping on a substrate held onto the stage 220 or being mixed into the bottom portion of the pre-wet chamber 210. Specifically, the cleaning liquid discharged from the nozzles 262 cleans the substrate WF held onto the substrate station 230, then drops on the upper surfaces of the plates 293-1 to 293-4, and flows into the drain pan 296 along the inclinations of the plates 293-1 to 293-4. The cleaning liquid that has flowed into the drain pan 296 is discharged to the outside of the pre-wet chamber 210 via the drain pipe 288.

Figure 7A:
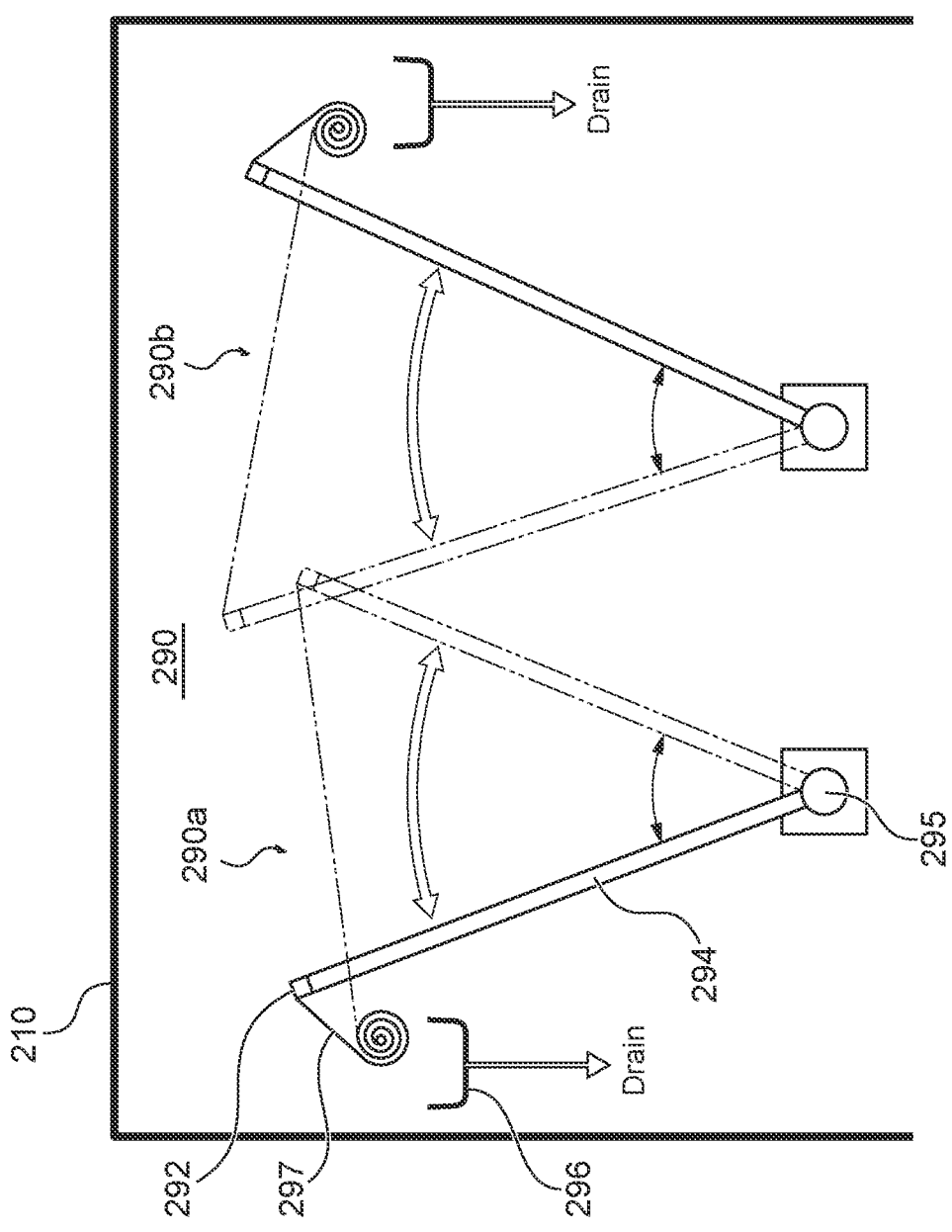
FIG. 7A is a drawing schematically illustrating one exemplary configuration of a shutter member.
Figure 7B:
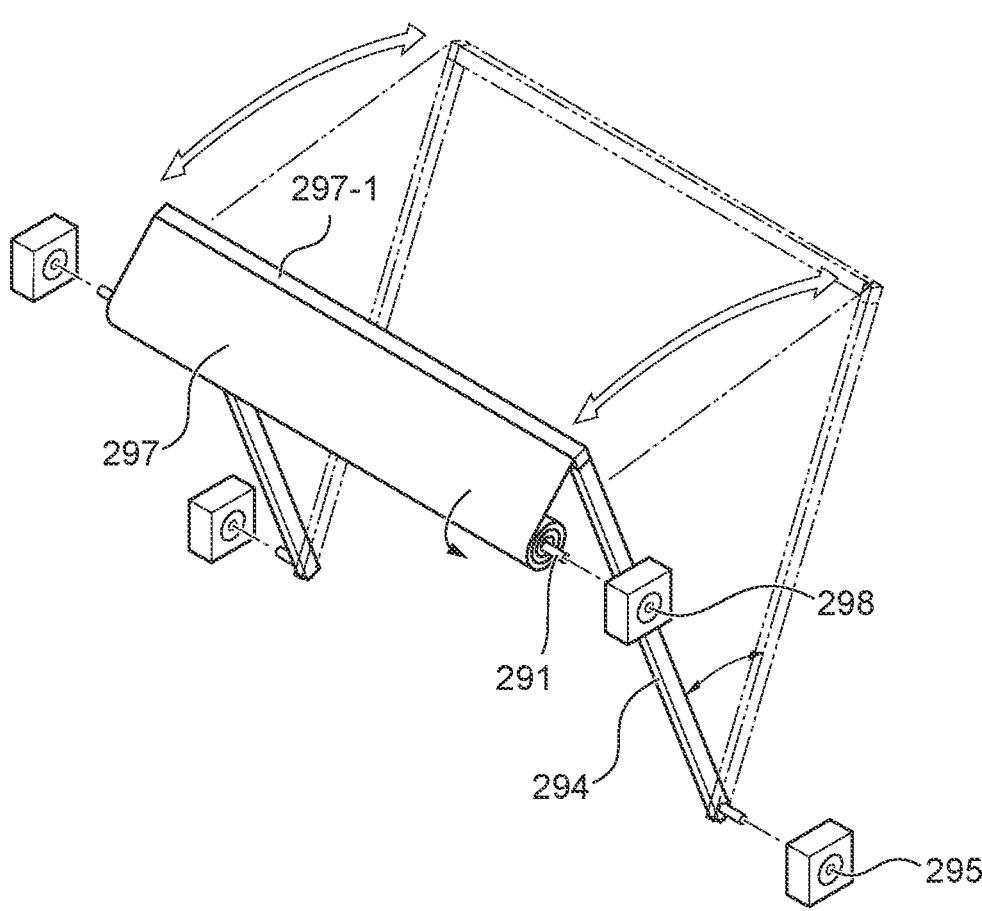
FIG. 7B is a drawing schematically illustrating the one exemplary configuration of the shutter member.
Figure 7C:
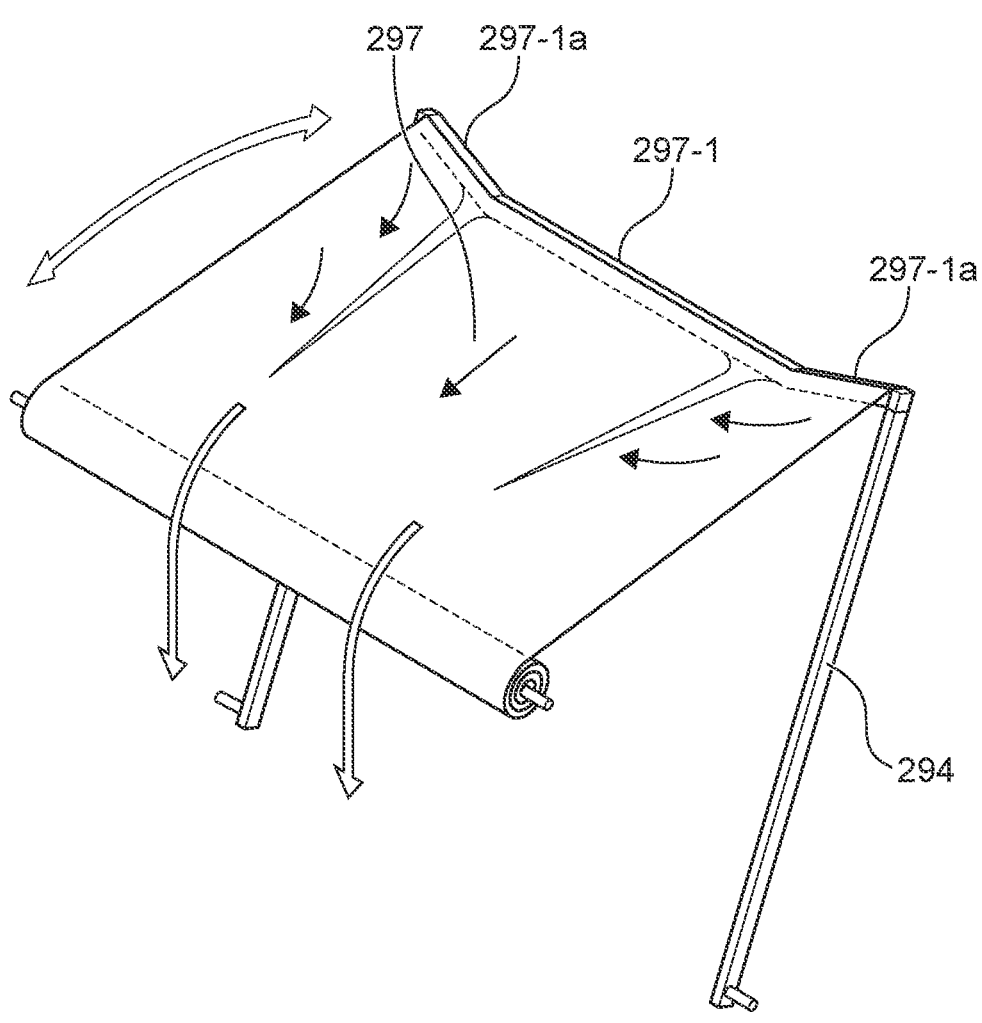
FIG. 7C is a drawing schematically illustrating the one exemplary configuration of the shutter member.

While the slide type shutter member 290 has been described above as an example, the shutter member 290 is not limited to this structure. FIG. 7A to FIG. 7C are drawings schematically illustrating one exemplary configuration of a shutter member. As illustrated in FIG. 7A to FIG. 7C, a roll type shutter member 290 can be used. That is, the shutter member 290 has a first shutter member 290a and a second shutter member 290b that are arranged symmetrically. Since the first shutter member 290a and the second shutter member 290b have a similar configuration, only the first shutter member 290a will be described.

The first shutter member 290a has a windable screen member 297. While one made of resin can be used for the screen member 297 as an example, the screen member 297 is not limited to this. The lower end portion of the screen member 297 is connected to a fixed shaft 291 extending in the horizontal direction perpendicular to the open/close direction of the first shutter member 290a. The fixed shaft 291 is connected to spiral springs 298. Meanwhile, a rod-shaped frame 297-1 extending in the horizontal direction perpendicular to the open/close direction of the first shutter member 290a is fixed to the upper end portion of the screen member 297.

As illustrated in FIG. 7C, the frame 297-1 has inclined portions 297-1a extending obliquely upward so as to have both end portions higher than the center portion. The formation of the inclined portions 297-1a avoids the cleaning liquid dropped on the upper surface of the screen member 297 flowing down in the direction perpendicular to the open/close direction of the first shutter member 290a. The upper surface of the screen member 297 forms an inclined surface declining toward the drain pan 296 when the first shutter member 290a is closed. This causes the cleaning liquid dropped on the upper surface of the screen member 297 to flow into the drain pan 296.

The frame 297-1 has both end portions connected to respective support pillars 294. The support pillars 294 are connected to respective rotation mechanisms 295 and rotatable centering around the rotation mechanisms 295. The rotation mechanism 295 is an exemplary drive mechanism that supplies a driving force for outspreading the screen member 297 so as to block the path for the substrate station 230 to move up and down. The spiral spring 298 is an exemplary winding mechanism for winding the screen member 297 while the driving force is not supplied. Similarly to above-described embodiment, by rotating the support pillars 294 clockwise in the viewpoint of FIG. 7A, the first shutter member 290a can be put in the blocking state. Further, by rotating the support pillars 294 counterclockwise, the screen member 297 is wound by the spiral springs 298, allowing the first shutter member 290*a* to be put in the opening state.

Figure 8A:
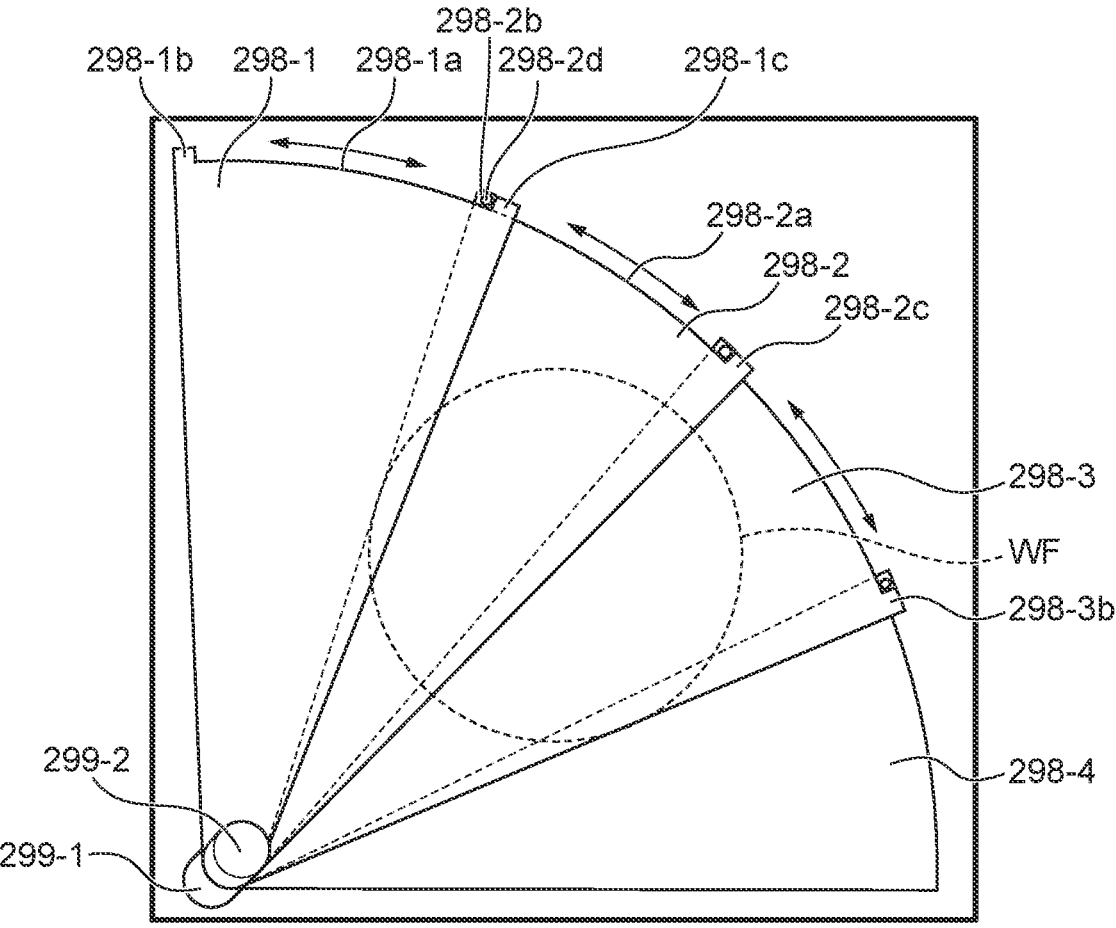
FIG. 8A is a drawing schematically illustrating one exemplary configuration of a shutter member.
Figure 8B:
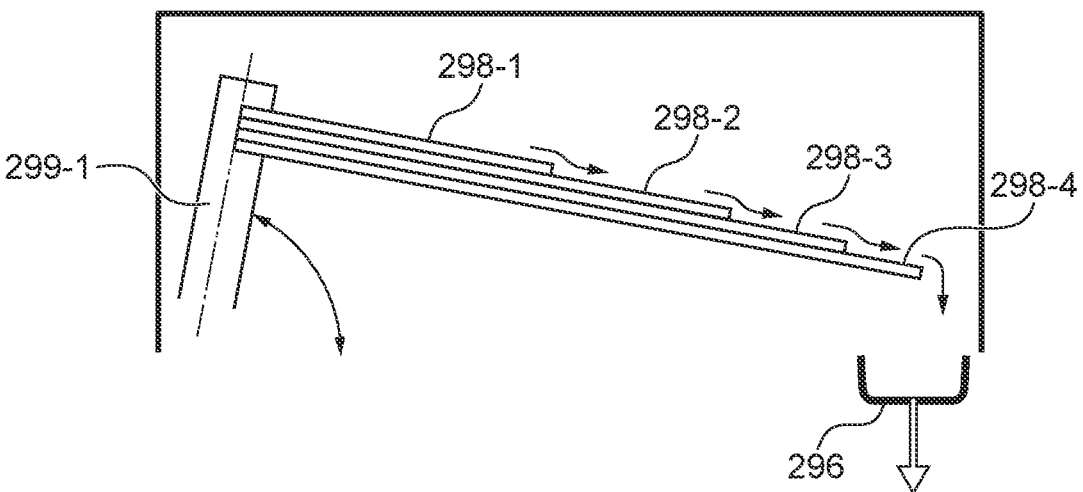
FIG. 8B is a drawing schematically illustrating the one exemplary configuration of the shutter member.

FIGS. 8A and 8B are drawings schematically illustrating one exemplary configuration of a shutter member. As illustrated in FIGS. 8A and 8B, the shutter member 290 may include a fan-shaped cover member. That is, the shutter member 290 has a plurality of (four in this embodiment) plate-shaped cover members 298-1 to 298-4 having a circular sector shape. The cover members 298-1 to 298-4 are arranged to be overlapped in the vertical direction with their angles shifted from one another. The cover members 298-1 to 298-3 are rotatably connected to a shaft 299-1 slightly inclined with respect to the vertical direction. The cover member 298-1 is a main blade rotatably connected to the shaft 299-1, and the cover members 298-2 and 298-3 are sub-blades configured to rotate relative to the shaft 299-1 following the rotation of the main blade. The cover member 298-4 is a fixed blade fixedly connected to the shaft 299-1. In this embodiment, the cover member 298-1 is arranged at the uppermost position, and the cover member 298-4 is arranged at the lowermost position.

The shutter member 290 has a rotation mechanism 299-2 for rotating the cover member 298-1 (main blade) around the shaft 299-1. The rotation mechanism 299-2 can be achieved by a known mechanism, such as a rotary cylinder. By rotating the cover member 298-1 (main blade) by the rotation mechanism 299-2, the shutter member 290 can be switched between the blocking state and the opening state. That is, the rotation mechanism 299-2 is configured to block the path for the substrate station 230 to move up and down by rotating the main blade in one direction to outspread the cover members 298-1 to 298-4. Further, the rotation mechanism 299-2 is configured to open the path for the substrate station 230 to move up and down by rotating the main blade in the opposite direction to fold the cover members 298-1 to 298-4.

More specifically, a cutout 298-1*a* is formed on the circular arc-shaped outer peripheral portion of the cover member 298-1. This forms protrusions 298-1*b* and 298-1*c* at both ends of the circular arc-shaped outer peripheral portion of the cover member 298-1. Similarly, protrusions 298-2*b* and 298-2*c* are formed at both ends of the circular arc-shaped outer peripheral portion of the cover member 298-2. Of the two protrusions 298-2*b* and 298-2*c*, a pin 298-2*d* is formed in the protrusion 298-2*b* that is overlapped with the cover member 298-1. The pin 298-2*d* extends in an upward direction to the height of the protrusion 298-1*c* of the cover member 298-1.

By rotating the cover member 298-1 (main blade) counterclockwise in the viewpoint of FIG. 8A, the protrusion 298-1*c* comes in contact with the pin 298-2*d*. This causes the cover member 298-1 (main blade) to take the cover member 298-2 (sub-blade) along and rotate it counterclockwise. In addition, the cover member 298-3 (sub-blade) has a structure similar to that of the cover member 298-2. Accordingly, the cover member 298-2 (sub-blade) takes the cover member 298-3 (sub-blade) along and rotate it counterclockwise. The cover member 298-4 (fixed blade) is fixedly connected to the shaft 299-1. Therefore, when a protrusion of the cover member 298-3 comes in contact with the pin of the cover member 298-4, the rotation of the cover members 298-1 to 298-3 stops. This results in the cover members 298-1 to 298-4 being outspread to put the shutter member 290 in the blocking state. Since the shaft 299-1 is inclined with respect to the vertical direction, the upper surfaces of the cover members 298-1 to 298-4 form inclined surfaces declining toward the drain pan 296 as illustrated in FIG. 8B. This causes the cleaning liquid dropped on the upper surfaces of the cover members 298-1 to 298-4 to flow into the drain pan 296. In this embodiment, while an example in which the shaft 299-1 is inclined with respect to the vertical direction is described, the shaft 299-1 may extend in the vertical direction without being limited to this. Even in this case, it is only necessary for the cover members 298-1 to 298-4 to form inclined surfaces declining toward the drain pan 296.

Conversely, by rotating the cover member 298-1 (main blade) clockwise from the blocking state in the viewpoint of FIG. 8A, the protrusion 298-1*b* comes in contact with the pin 298-2*d*. This causes the cover member 298-1 (main blade) to drag the cover member 298-2 (sub-blade) and rotate it clockwise. Similarly, the cover member 298-2 (sub-blade) drags the cover member 298-3 (sub-blade) and rotate it clockwise. When a protrusion of the cover member 298-3 comes in contact with the pin of the cover member 298-4, the rotation of the cover members 298-1 to 298-3 stops. This results in the cover members 298-1 to 298-4 being folded to put the shutter member 290 in the opening state.

With this embodiment, it is not necessary to invert upside down a mechanism that holds a substrate and move it up and down, as done in the prior art. Accordingly, since a space for inverting upside down the mechanism that holds a substrate and moving it up and down is not necessary, the size of the pre-wet module 200, especially the size in the height direction can be decreased. Additionally, with this embodiment, since a cleaning region and a deaeration region of a substrate can be separated by disposing the substrate station 230 and the shutter member 290, the small-sized pre-wet module 200 that can concurrently perform the cleaning process and the deaeration process in an efficient manner can be achieved.

Next, operations of the pre-wet module 200 illustrated in FIG. 5 will be described. FIG. 9A to FIG. 9H are drawings for schematically describing operations of the pre-wet module illustrated in FIG. 5.

Figure 9A:
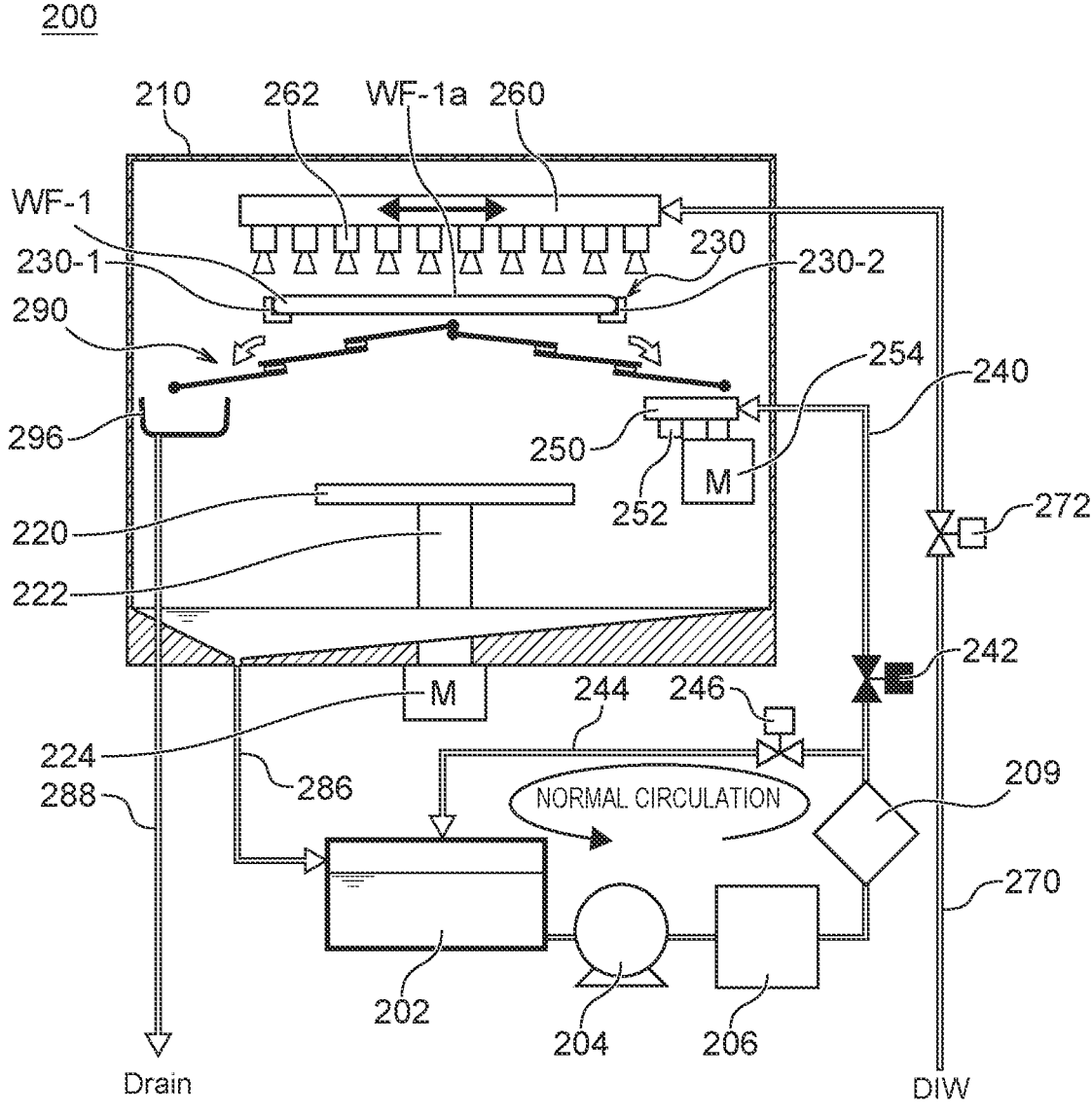
FIG. 9A is a drawing for schematically describing an operation of the pre-wet module illustrated in FIG. 5.
Figure 9B:
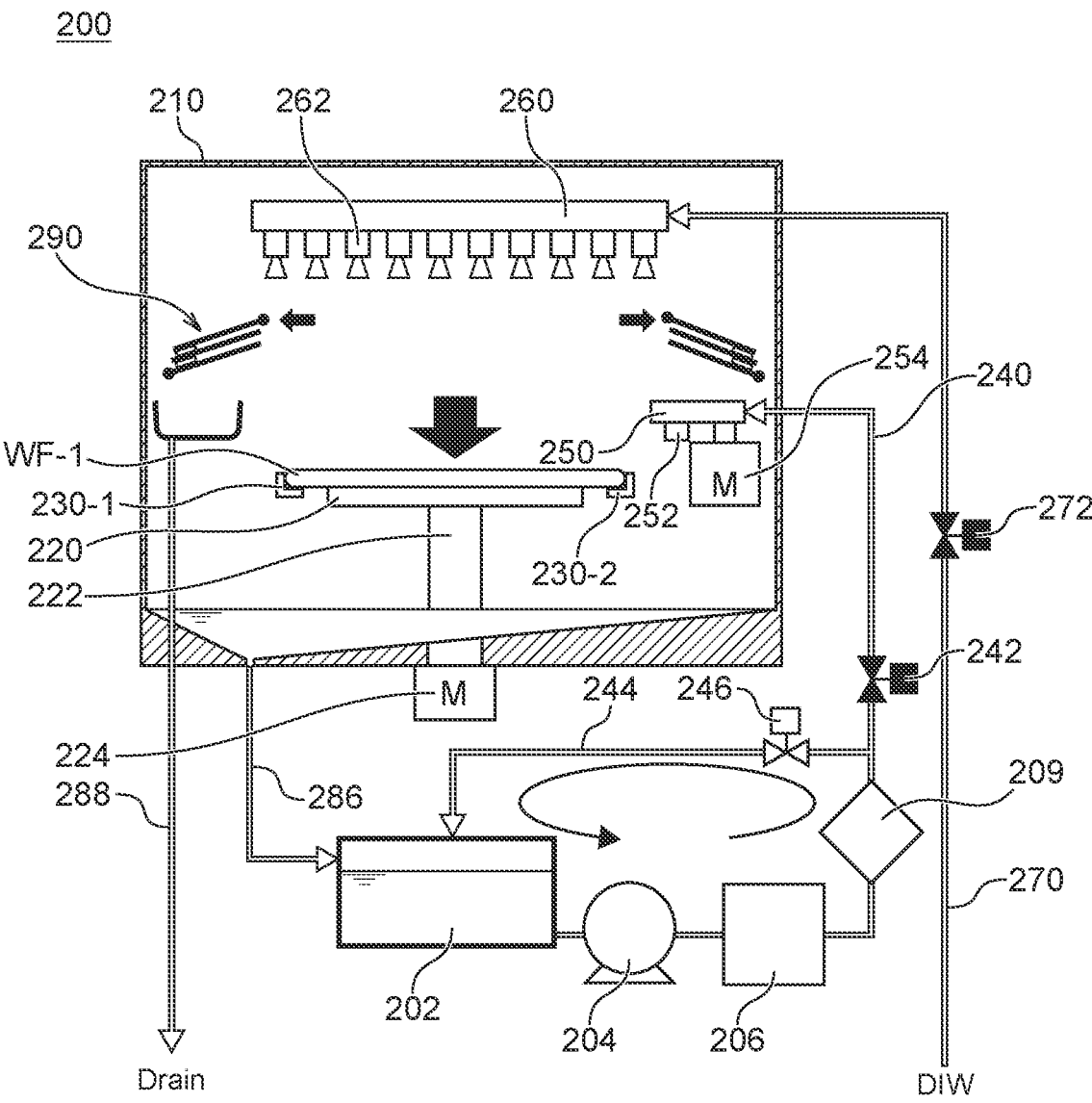
FIG. 9B is a drawing for schematically describing an operation of the pre-wet module illustrated in FIG. 5.

FIG. 9A illustrates a state where the cleaning process is being performed on the substrate WF. As illustrated in FIG. 9A, during the cleaning process, the pre-wet module 200 holds a first substrate WF-1 that has been gripped or released from the transfer robot 110 by the substrate station 230. At this time, the substrate station 230 is arranged at the cleaning position immediately below the nozzles 262 (between the nozzles 262 and the shutter member 290) and holds the back surface of the first substrate WF-1 with a surface to be processed WF-1*a* facing upward. The pre-wet module 200 puts the shutter member 290 in the blocking state.

The pre-wet module 200 arranges the deaerated liquid supply member 250 at the retracted position. The pre-wet module 200 drives the pump 204, closes the supply valve 242, and opens the first circulation valve 246. This results in the pre-wet module 200 removing the dissolved oxygen contained in the deaerated liquid while circulating the deaerated liquid. The pre-wet module 200 also opens the supply valve 272. This causes the cleaning liquid to be supplied to the surface to be processed WF-1*a* of the first substrate WF-1 from the nozzles 262 of the cleaning liquid supply member 260. The cleaning liquid falls on the shutter member 290 after cleaning the surface to be processed WF-1*a* and flows into the drain pan 296 by the inclination of the shutter member 290. The cleaning liquid that has flowed into the drain pan 296 is discharged to the outside of the pre-wet chamber 210 via the drain pipe 288.

After the cleaning process of the first substrate WF-1 is completed, the pre-wet module 200 closes the supply valve 272 as illustrated in FIG. 9B. Subsequently, the pre-wet module 200 puts the shutter member 290 in the opening state. Subsequently, the pre-wet module 200 moves the substrate station 230 down to a delivery and receipt position of a substrate to deliver the first substrate WF-1 to the stage 220.

Figure 9C:
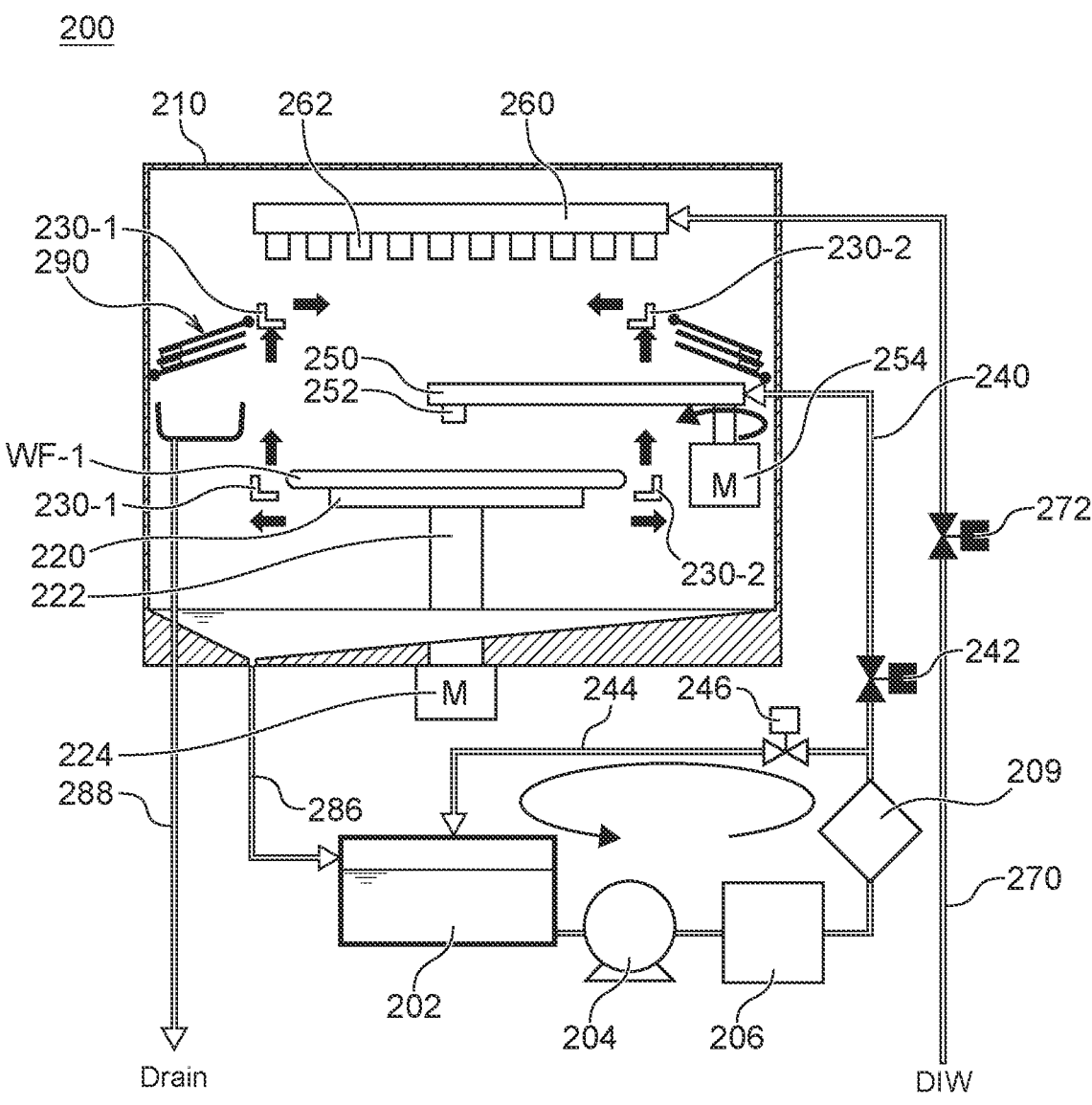
FIG. 9C is a drawing for schematically describing an operation of the pre-wet module illustrated in FIG. 5.

Subsequently, as illustrated in FIG. 9C, the pre-wet module 200 moves the substrate station 230 up to the cleaning position. Subsequently, the pre-wet module 200 arranges the deaerated liquid supply member 250 at the supply position.

Figure 9D:
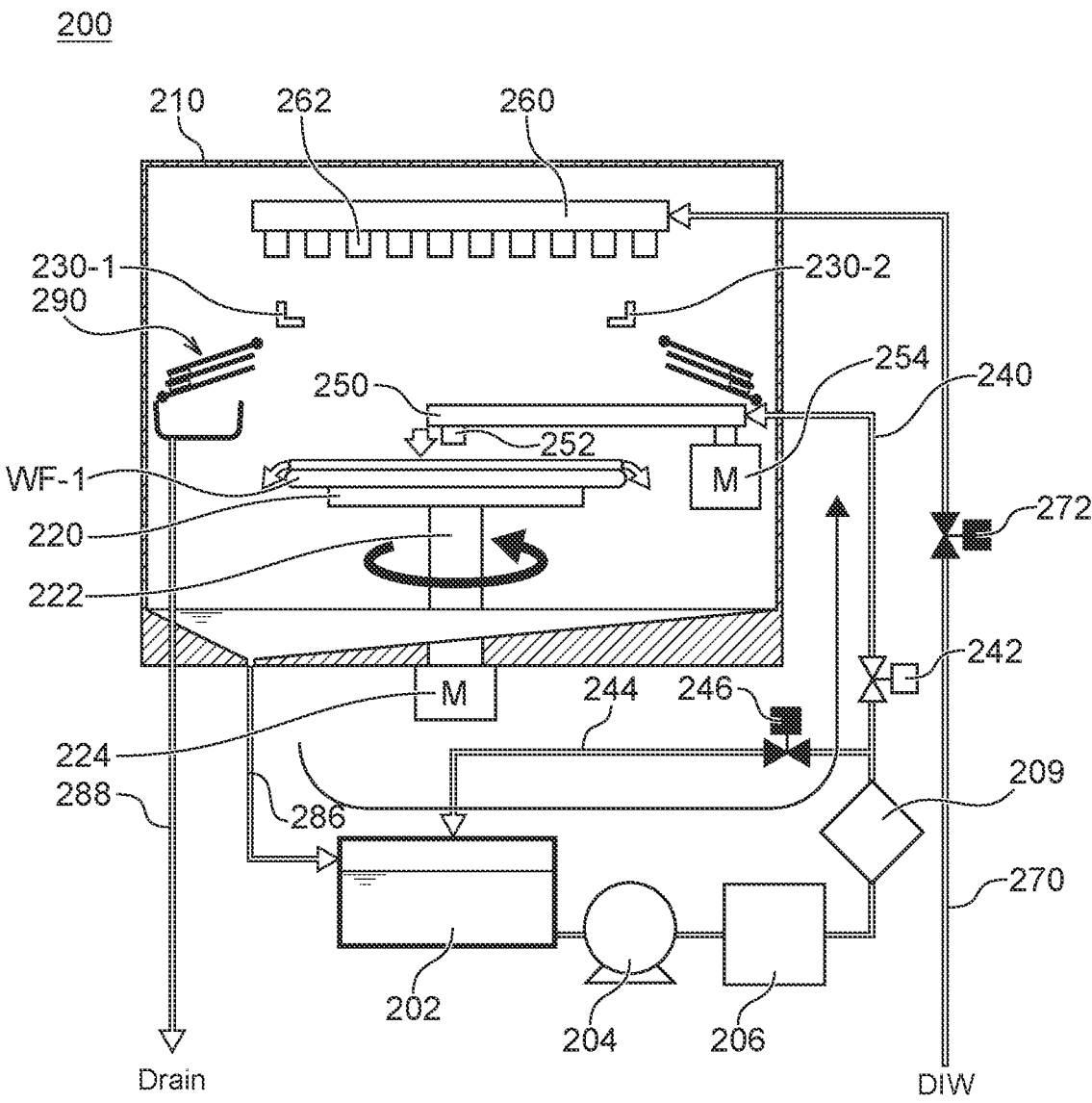
FIG. 9D is a drawing for schematically describing an operation of the pre-wet module illustrated in FIG. 5.

Subsequently, as illustrated in FIG. 9D, the pre-wet module 200 rotates the stage 220, opens the supply valve 242, and closes the first circulation valve 246. This causes the deaerated liquid to be supplied to the center of the surface to be processed WF-1a of the first substrate WF-1 from the nozzle 252 of the deaerated liquid supply member 250. The deaerated liquid supplied to the center of the surface to be processed WF-1a spreads to the end portion of the first substrate WF-1 by centrifugal force in association with the rotation of the first substrate WF-1 to deaerate the surface to be processed WF-1a. The deaerated liquid falls from the end portion of the first substrate WF-1, is led to the second circulation pipe 286 by the inclination of the bottom surface of the pre-wet chamber 210, and is returned to the circulation tank 202.

Figure 9E:
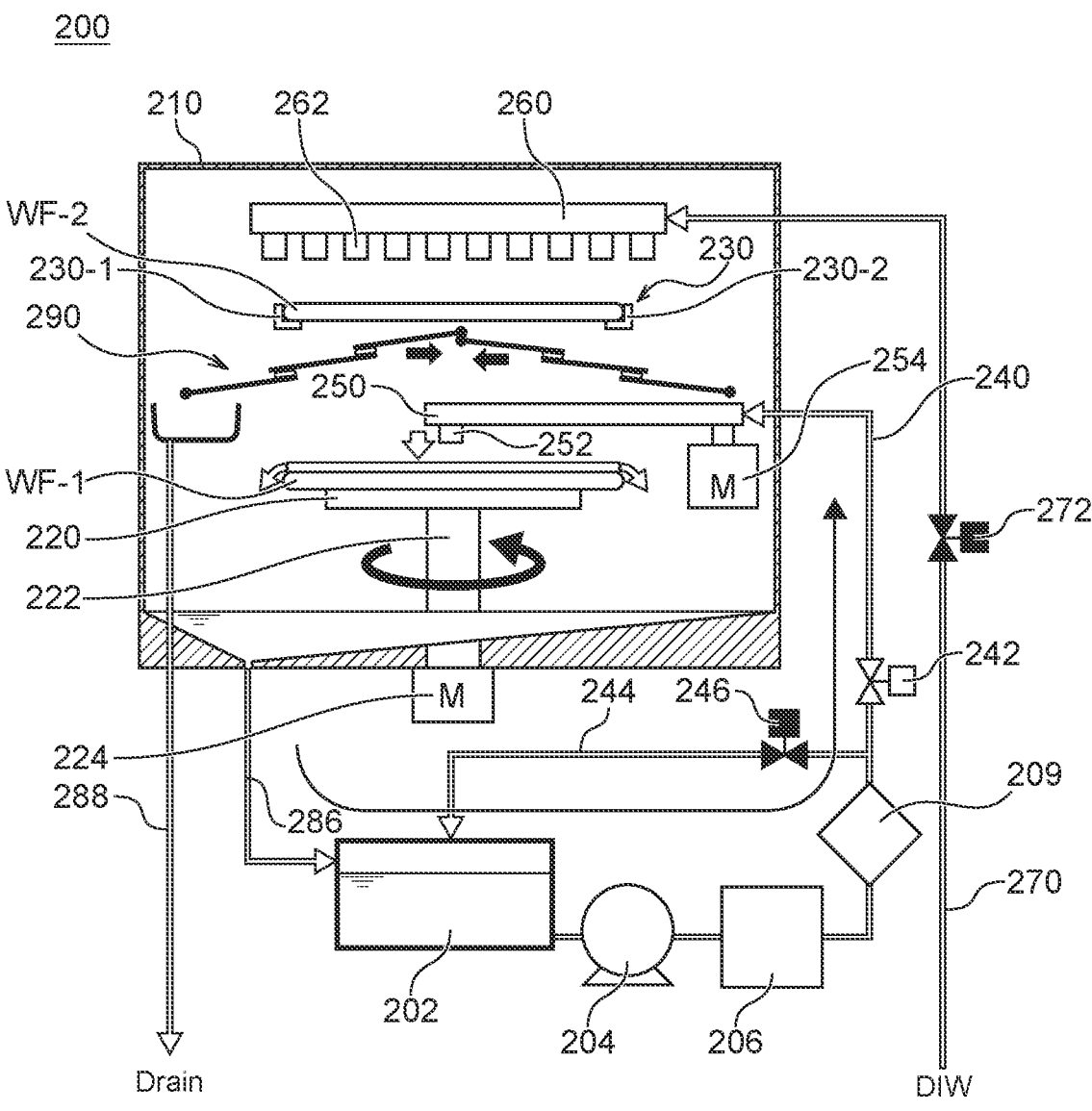
FIG. 9E is a drawing for schematically describing an operation of the pre-wet module illustrated in FIG. 5.

Subsequently, as illustrated in FIG. 9E, the pre-wet module 200 holds a second substrate WF-2 that has been gripped or released from the transfer robot 110 by the substrate station 230. Further, the pre-wet module 200 puts the shutter member 290 in the blocking state.

Figure 9F:
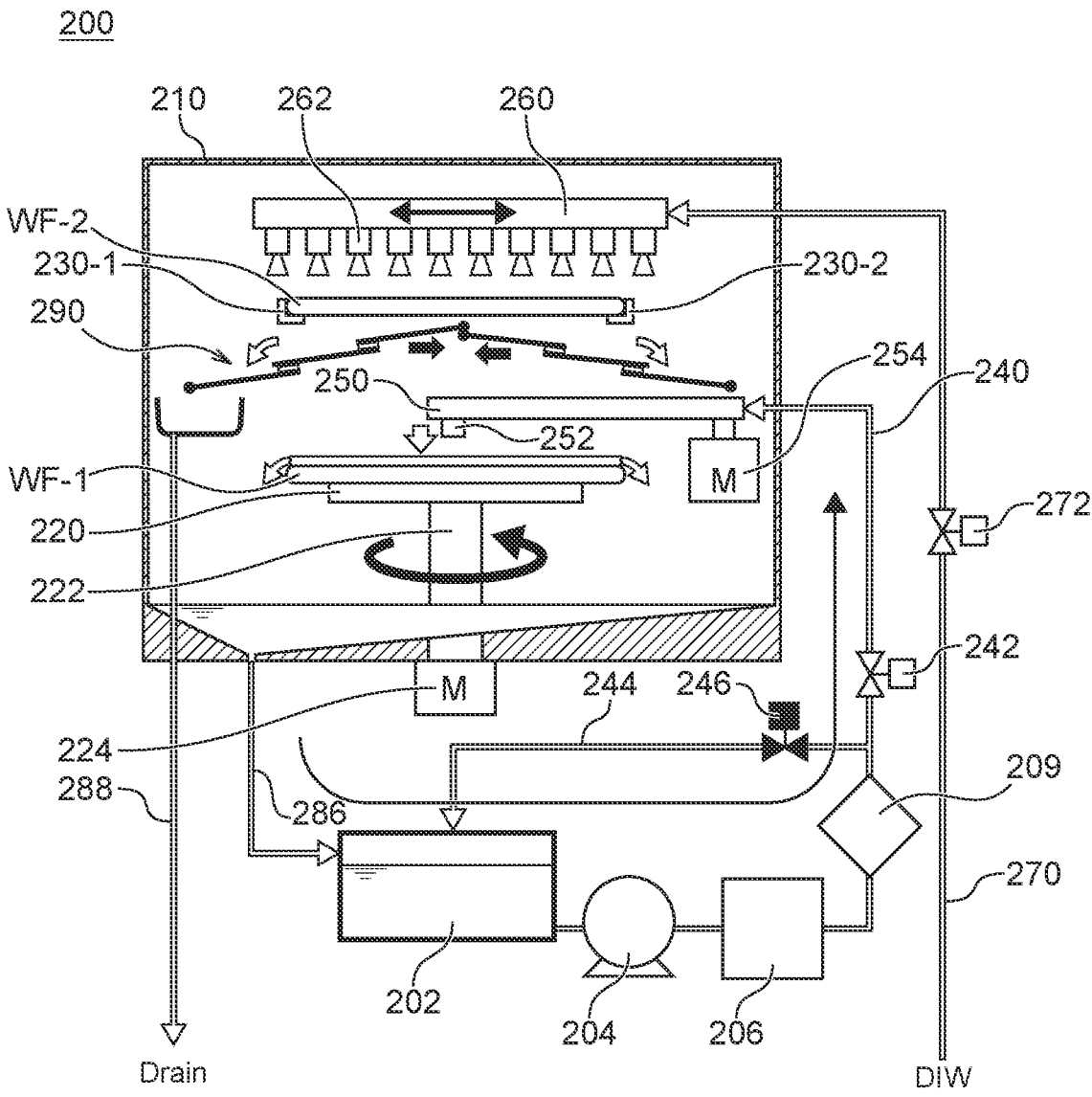
FIG. 9F is a drawing for schematically describing an operation of the pre-wet module illustrated in FIG. 5.

Subsequently, as illustrated in FIG. 9F, the pre-wet module 200 opens the supply valve 272. This causes the cleaning liquid to be supplied to a surface to be processed WF-2a of the second substrate WF-2 from the nozzles 262 of the cleaning liquid supply member 260 to clean the surface to be processed WF-2a. With this embodiment, since the cleaning process can be performed on the second substrate WF-2 simultaneously when the deaeration process is performed on the first substrate WF-1, the different pre-processes can be concurrently performed on a plurality of substrates in an efficient manner.

Figure 9G:
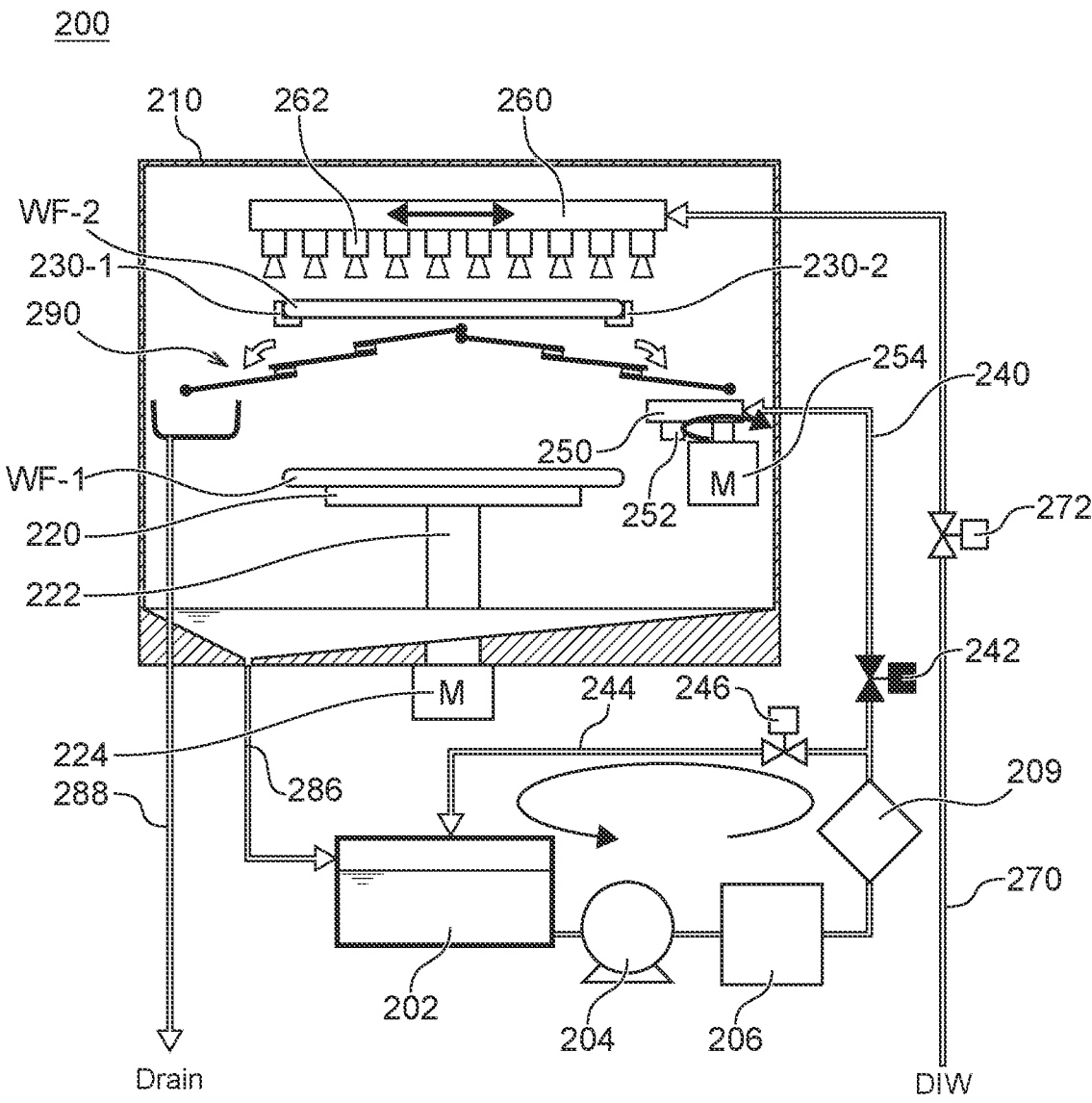
FIG. 9G is a drawing for schematically describing an operation of the pre-wet module illustrated in FIG. 5.

Subsequently, as illustrated in FIG. 9G, the pre-wet module 200 closes the supply valve 242 and opens the first circulation valve 246. Further, the pre-wet module 200 arranges the deaerated liquid supply member 250 at the retracted position.

Figure 9H:
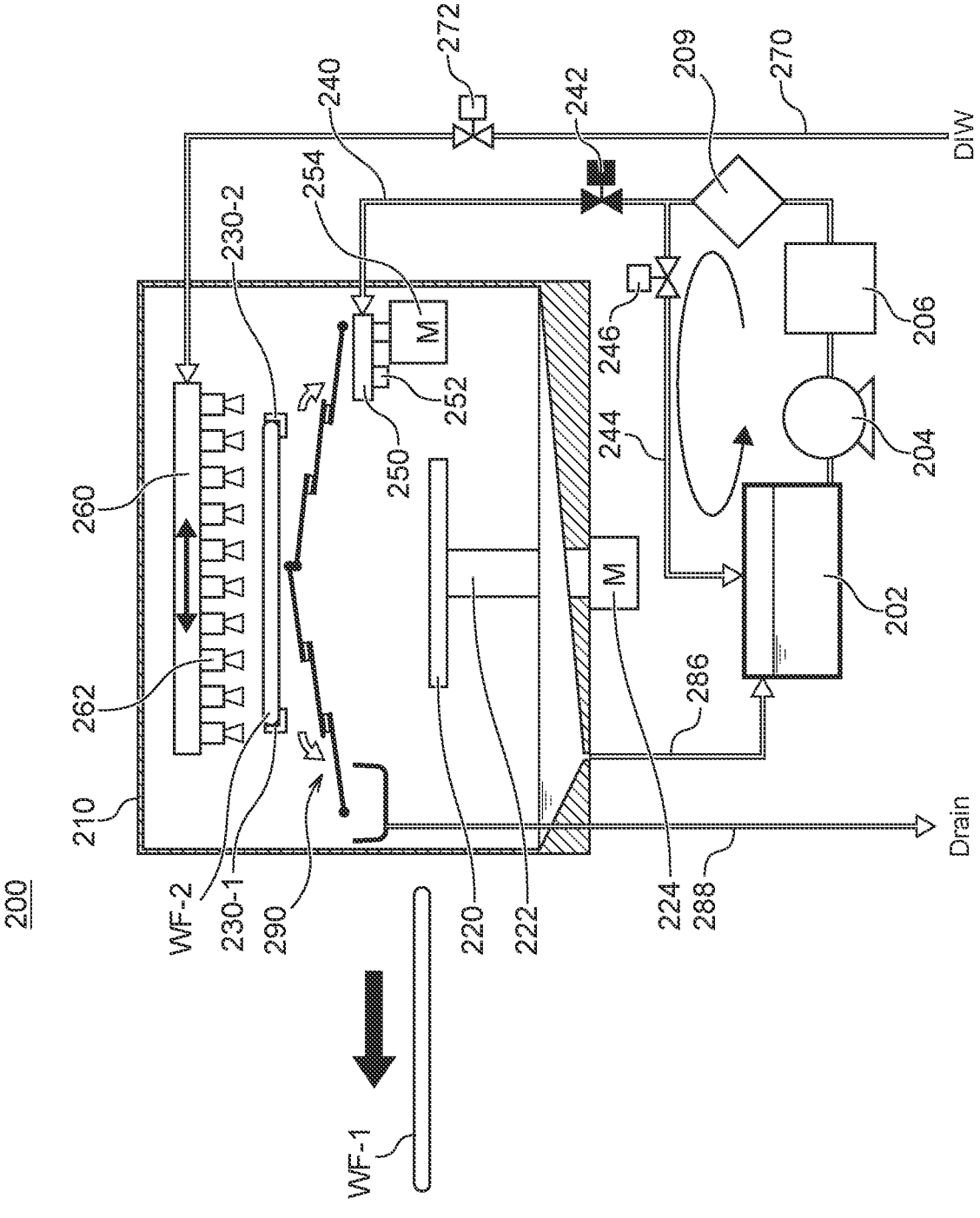
FIG. 9H is a drawing for schematically describing an operation of the pre-wet module illustrated in FIG. 5.

Subsequently, as illustrated in FIG. 9H, the pre-wet module 200 unloads the first substrate WF-1 from the pre-wet module 200 by the transfer device 700. The pre-wet module 200 repeatedly performs the same processes on subsequent substrates afterward.

With this embodiment, it is not necessary to invert upside down a mechanism that holds a substrate and move it up and down, as done in the prior art. Accordingly, since a space for inverting upside down the mechanism that holds a substrate and moving it up and down is not necessary, the size of the pre-wet module 200, especially the size in the height direction can be decreased. As a result, with this embodiment, the small-sized pre-wet module 200 that can concurrently perform different pre-processes (cleaning process and deaeration process) can be achieved.

While some embodiments of the present invention have been described above, the above-described embodiments of the present invention are to facilitate understanding of the present invention without limiting the present invention. The present invention can be changed or improved without departing from the gist thereof, and of course, the equivalents of the present invention are included in the present invention. It is possible to appropriately combine or omit respective components according to claims and description in a range in which at least a part of the above-described problems can be solved, or a range in which at least a part of the effects can be exhibited.

This application discloses, as one embodiment, a pre-wet module that includes a stage, a rotation mechanism, a cleaning liquid supply member, and a deaerated liquid supply member. The stage is configured to hold a back surface of a substrate with a surface to be processed facing upward. The rotation mechanism is configured to rotate the stage. The cleaning liquid supply member has a nozzle arranged above the stage. The cleaning liquid supply member is configured to supply a cleaning liquid in a direction to the stage via the nozzle. The deaerated liquid supply member is configured to supply a deaerated liquid to a surface to be processed of a substrate held onto the stage. The deaerated liquid supply member is configured to be movable between a supply position and a retracted position. The supply position is located between the nozzle and the surface to be processed of the substrate, and the retracted position is retracted from between the nozzle and the surface to be processed of the substrate.

This application discloses, as one embodiment, the pre-wet module that further includes a circulation tank configured to accumulate a deaerated liquid, a supply pipe connecting the circulation tank to the deaerated liquid supply member, a pump for supplying the deaerated liquid accumulated in the circulation tank via the supply pipe to the deaerated liquid supply member, a first circulation pipe branched from a downstream side of the pump of the supply pipe and connected to the circulation tank, a supply valve configured to open and close a downstream side with respect to a branched position of the supply pipe to the first circulation pipe, and a first circulation valve configured to open and close the first circulation pipe.

This application discloses, as one embodiment, the pre-wet module that further includes a liquid discharge pipe connected to a bottom portion of a pre-wet chamber housing the stage, the cleaning liquid supply member, and the deaerated liquid supply member, a second circulation pipe branched from the liquid discharge pipe and connected to the circulation tank, a liquid discharge valve configured to open and close a downstream side with respect to a branched position of the liquid discharge pipe to the second circulation pipe, and a second circulation valve configured to open and close the second circulation pipe.

This application discloses, as one embodiment, the pre-wet module that further includes a substrate station configured to hold a substrate with a surface to be processed facing upward at a cleaning position between the deaerated liquid supply member arranged at the supply position and the nozzle and move up and down in order to grip or release a substrate from or to the stage, and a shutter member configured to block and open a path for the substrate station to move up and down.

This application discloses, as one embodiment, the pre-wet module in which the shutter member is configured such that the shutter member blocks the path for the substrate station to move up and down when a cleaning liquid is supplied from the nozzle to a substrate held onto the substrate station arranged at the cleaning position and open the path for the substrate station to move up and down when delivery and receipt of a substrate is performed between the substrate station and the stage.

This application discloses, as one embodiment, the pre-wet module in which the shutter member includes a plurality of plates, a rail disposed between the plurality of plates, a slider slidably movable along the rail, the slider coupling the plurality of plates, and a drive mechanism configured to block the path for the substrate station to move up and down by slidably moving and outspreading the plurality of plates and open the path for the substrate station to move up and down by slidably moving and folding the plurality of plates.

This application discloses, as one embodiment, the pre-wet module in which the shutter member includes a windable screen member, a drive mechanism configured to supply a driving force for outspreading the screen member so as to block the path for the substrate station to move up and down, and a winding mechanism for winding the screen member when the driving force is unsupplied.

This application discloses, as one embodiment, the pre-wet module in which the shutter member includes a shaft, a plurality of cover members including a main blade rotatably connected to the shaft and a sub-blade configured to rotate relative to the shaft following a rotation of the main blade, and a rotation mechanism configured to block the path for the substrate station to move up and down by rotating the main blade in one direction to outspread the plurality of cover members and open the path for the substrate station to move up and down by rotating the main blade in an opposite direction to fold the plurality of cover members.

This application discloses, as one embodiment, the pre-wet module that further includes a circulation tank configured to accumulate a deaerated liquid, a supply pipe connecting the circulation tank to the deaerated liquid supply member, a pump for supplying the deaerated liquid accumulated in the circulation tank via the supply pipe to the deaerated liquid supply member, a first circulation pipe branched from a downstream side of the pump of the supply pipe and connected to the circulation tank, a supply valve configured to open and close a downstream side with respect to a branched position of the supply pipe to the first circulation pipe, a first circulation valve configured to open and close the first circulation pipe, and a second circulation pipe connecting a bottom portion of a pre-wet chamber to the circulation tank, the pre-wet chamber housing the stage, the cleaning liquid supply member, and the deaerated liquid supply member.

This application discloses, as one embodiment, the pre-wet module that further includes a drain pan configured to receive a cleaning liquid supplied from the nozzle and dropped from the shutter member, and a drain pipe for discharging the cleaning liquid received by the drain pan to an outside of the pre-wet chamber.

REFERENCE SIGNS LIST

200 . . . pre-wet module
202 . . . circulation tank
204 . . . pump
210 . . . pre-wet chamber
220 . . . stage
224 . . . rotation mechanism
230 . . . substrate station
240 . . . supply pipe
240a . . . branched position
242 . . . supply valve
244 . . . first circulation pipe
246 . . . first circulation valve
250 . . . deaerated liquid supply member
252 . . . nozzle
254 . . . rotation mechanism
260 . . . cleaning liquid supply member
262 . . . nozzle 280 . . . liquid discharge pipe
280a . . . branched position
282 . . . liquid discharge valve
284 . . . second circulation valve
286 . . . second circulation pipe
288 . . . drain pipe
290 . . . shutter member
290a . . . first shutter member
290b . . . second shutter member
293-1 to 293-4 . . . plates
293-2b . . . rail
293-2c . . . slider
295 . . . rotation mechanism
296 . . . drain pan
297 . . . screen member
298-1 to 298-4 . . . cover members
299-1 . . . shaft
299-2 . . . rotation mechanism
WF . . . substrate
WF-a . . . surface to be processed

The invention claimed is:

1. A pre-wet module comprising:
a stage configured to hold a back surface of a substrate with a surface to be processed facing upward;
a rotation mechanism configured to rotate the stage;
a cleaning liquid supply member having a nozzle arranged above the stage, the cleaning liquid supply member being configured to supply a cleaning liquid in a direction of the stage via the nozzle;
a deaerated liquid supply member configured to supply a deaerated liquid to a surface to be processed of a substrate held onto the stage, the deaerated liquid supply member being configured to be movable between a supply position and a retracted position, the supply position being located between the nozzle and the surface to be processed of the substrate, and the retracted position being retracted from between the nozzle and the surface to be processed of the substrate,
a substrate station configured to hold a substrate with a surface to be processed facing upward at a cleaning position between the deaerated liquid supply member arranged at the supply position and the nozzle and move up and down in order to grip or release a substrate from or to the stage; and
a shutter member configured to block and open a path for the substrate station to move up and down.

2. The pre-wet module according to claim 1, wherein the shutter member is configured such that the shutter member blocks the path for the substrate station to move up and down when a cleaning liquid is supplied from the nozzle to a substrate held onto the substrate station arranged at the cleaning position and open the path for the substrate station to move up and down when delivery and receipt of a substrate is performed between the substrate station and the stage.

3. The pre-wet module according to claim 2, wherein the shutter member includes:
a plurality of plates;
a rail disposed between the plurality of plates;
a slider slidably movable along the rail, the slider coupling the plurality of plates; and
a drive mechanism configured to block the path for the substrate station to move up and down by slidably moving and outspreading the plurality of plates and open the path for the substrate station to move up and down by slidably moving and folding the plurality of plates.

4. The pre-wet module according to claim 2, wherein the shutter member includes:

a windable screen member;

a drive mechanism configured to supply a driving force for outspreading the screen member so as to block the path for the substrate station to move up and down; and a winding mechanism for winding the screen member when the driving force is unsupplied.

5. The pre-wet module according to claim 2, wherein the shutter member includes:

a shaft;

a plurality of cover members including a main blade rotatably connected to the shaft and a sub-blade configured to rotate relative to the shaft following a rotation of the main blade; and a rotation mechanism configured to block the path for the substrate station to move up and down by rotating the main blade in one direction to outspread the plurality of cover members and open the path for the substrate station to move up and down by rotating the main blade in an opposite direction to fold the plurality of cover members.

6. The pre-wet module according to claim 1, further comprising:

a circulation tank configured to accumulate a deaerated liquid;

a supply pipe connecting the circulation tank to the deaerated liquid supply member;

a pump for supplying the deaerated liquid accumulated in the circulation tank via the supply pipe to the deaerated liquid supply member;

a first circulation pipe branched from a downstream side of the pump of the supply pipe and connected to the circulation tank;

a supply valve configured to open and close a downstream side with respect to a branched position of the supply pipe to the first circulation pipe;

a first circulation valve configured to open and close the first circulation pipe; and a second circulation pipe connecting a bottom portion of a pre-wet chamber to the circulation tank, the pre-wet chamber housing the stage, the cleaning liquid supply member, and the deaerated liquid supply member.

7. The pre-wet module according to claim 6, further comprising:

a drain pan configured to receive a cleaning liquid supplied from the nozzle and dropped from the shutter member; and a drain pipe for discharging the cleaning liquid received by the drain pan to an outside of the pre-wet chamber.

8. The pre-wet module according to claim 6, further comprising:

a liquid discharge pipe connected to the bottom portion of the pre-wet chamber housing the stage, the cleaning liquid supply member, and the deaerated liquid supply member;

the second circulation pipe branched from the liquid discharge pipe and connected to the circulation tank;

a liquid discharge valve configured to open and close a downstream side with respect to a branched position of the liquid discharge pipe to the second circulation pipe; and a second circulation valve configured to open and close the second circulation pipe.

* * * * *